(12) United States Patent
Asao et al.

(10) Patent No.: US 9,855,734 B2
(45) Date of Patent: Jan. 2, 2018

(54) WAFER PROCESSING METHOD

(71) Applicant: SEKISUI CHEMICAL CO., LTD., Osaka (JP)

(72) Inventors: Takahiro Asao, Osaka (JP); Toru Tonegawa, Osaka (JP); Kozo Ueda, Osaka (JP); Hirohide Yabuguchi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/420,450

(22) PCT Filed: Aug. 6, 2013

(86) PCT No.: PCT/JP2013/071208
§ 371 (c)(1),
(2) Date: Feb. 9, 2015

(87) PCT Pub. No.: WO2014/024861
PCT Pub. Date: Feb. 13, 2014

(65) Prior Publication Data
US 2015/0217552 A1  Aug. 6, 2015

(30) Foreign Application Priority Data

Aug. 10, 2012  (JP) .................................. 2012-178576
Dec. 3, 2012  (JP) .................................. 2012-264463
Jun. 10, 2013  (JP) .................................. 2013-122027

(51) Int. Cl.
| *B32B 37/12* | (2006.01) |
| *B32B 37/30* | (2006.01) |
| *H01L 23/00* | (2006.01) |
| *C09J 11/06* | (2006.01) |
| *H01L 21/683* | (2006.01) |
| *C09J 5/06* | (2006.01) |
| *B32B 43/00* | (2006.01) |

(52) U.S. Cl.
CPC .......... *B32B 37/1207* (2013.01); *B32B 37/12* (2013.01); *B32B 37/30* (2013.01); *C09J 5/06* (2013.01); *C09J 11/06* (2013.01); *H01L 21/6835* (2013.01); *H01L 24/83* (2013.01); *H01L 24/94* (2013.01); *H01L 24/98* (2013.01); *B32B 43/006* (2013.01); *B32B 2037/1253* (2013.01); *B32B 2307/20* (2013.01); *B32B 2310/0806* (2013.01); *B32B 2457/14* (2013.01); *C09J 2203/326* (2013.01); *C09J 2205/302* (2013.01); *C09J 2205/31* (2013.01); *H01L 21/6836* (2013.01); *H01L 2221/6834* (2013.01); *H01L 2221/68327* (2013.01); *H01L 2221/68381* (2013.01); *H01L 2924/12042* (2013.01)

(58) Field of Classification Search
CPC ........... H01L 2924/12042; H01L 24/94; H01L 2221/68381; H01L 21/6836; H01L 24/83; H01L 24/98; H01L 21/6835; H01L 2221/68327; H01L 2221/6834; H01L 2924/00; B32B 2037/1253; B32B 2457/14; B32B 37/1207; B32B 37/12; B32B 37/30; B32B 2307/20; B32B 2310/0806; C09J 2203/326; C09J 11/06; C09J 5/06; C09J 2205/302; C09J 2205/31
USPC ........................................................ 156/247
See application file for complete search history.

(56) References Cited

U.S. PATENT DOCUMENTS

| 2005/0233547 | A1* | 10/2005 | Noda | .................... | B32B 43/006 |
| | | | | | 438/459 |
| 2010/0129985 | A1* | 5/2010 | Ootake | ..................... | B32B 7/12 |
| | | | | | 438/464 |
| 2010/0167073 | A1* | 7/2010 | Kitakatsu | ............... | C08G 59/08 |
| | | | | | 428/473.5 |
| 2011/0308739 | A1* | 12/2011 | McCutcheon | ........ | H01L 21/187 |
| | | | | | 156/766 |
| 2013/0071658 | A1 | 3/2013 | Nomura et al. | | |

(Continued)

FOREIGN PATENT DOCUMENTS

| JP | 2002-237471 | 8/2002 |
| JP | 2003-231872 | 8/2003 |

(Continued)

OTHER PUBLICATIONS

International Search Report dated Nov. 5, 2013 in International (PCT) Application No. PCT/JP2013/071208.

*Primary Examiner* — Philip Tucker
*Assistant Examiner* — Vicki Wu
(74) *Attorney, Agent, or Firm* — Wenderoth, Lind & Ponack L.L.P.

(57) ABSTRACT

Provided is a method of treating a wafer in the state where the wafer is fixed on a support plate with an adhesive composition. Although the wafer is treated by a chemical, heating, or exothermic treatment, the method achieves sufficient adhesiveness during the step of treating a surface of the wafer and allows detachment of the support plate from the wafer without damaging the wafer or leaving the adhesive on the wafer after the wafer treating step. The method of treating a wafer of the present invention includes the steps of: fixing a wafer on a support plate via an adhesive composition containing a curable adhesive component to be crosslinked and cured by light irradiation or heating; crosslinking and curing the curable adhesive component by light irradiation or heating of the adhesive composition; treating a surface of the wafer fixed on the support plate by a chemical, heating, or exothermic treatment; and detaching the support plate from the treated wafer.

1 Claim, No Drawings

(56) References Cited

U.S. PATENT DOCUMENTS

2013/0084459 A1* 4/2013 Larson ..................... C09J 4/00
                                                       428/422
2013/0220533 A1* 8/2013 Tonegawa .............. C09J 183/04
                                                       156/247

FOREIGN PATENT DOCUMENTS

| JP | 2004-182797 | 7/2004 |
| JP | 2009-146974 | 7/2009 |
| JP | 2009-170886 | 7/2009 |
| JP | 2009146974 A * | 7/2009 |
| JP | 2010-205807 | 9/2010 |
| JP | 2012-109585 | 6/2012 |
| TW | 201022394 | 6/2010 |
| WO | 2011/118506 | 9/2011 |
| WO | 2012/036209 | 3/2012 |

* cited by examiner

WAFER PROCESSING METHOD

TECHNICAL FIELD

The present invention relates to a method of treating a wafer in the state where the wafer is fixed on a support plate via an adhesive composition. Although the wafer is treated by a chemical, heating, or exothermic treatment, the method achieves sufficient adhesiveness during the step of treating a surface of the wafer and allows detachment of the support plate from the wafer without damaging the wafer or leaving the adhesive on the wafer after the wafer treating step.

BACKGROUND ART

In production of semiconductor chips, wafers are fixed on support plates for easy handling and prevention of breakage of wafers during wafer treatment. For example, if a thick wafer, such as a wafer cut out from a silicon single crystal with high purity, is to be grinded into a thin wafer having a predetermined thickness, the thick wafer is bonded to a support plate via an adhesive composition.

The adhesive composition for bonding a wafer to a support plate is required to have high adhesiveness allowing a wafer to be firmly fixed during the step of treating the wafer and to have a property allowing detachment of the wafer without damaging the wafer after the step of treating the wafer (hereinafter, also referred to as "high adhesiveness and easy detachment").

As an adhesive composition achieving high adhesiveness and easy detachment, Patent Literature 1 discloses a method of treating a wafer by using a double-sided adhesive tape including an adhesive layer that contains a gas generating agent (e.g. azo compound) that generates a gas by stimulation. In the method of treating a wafer disclosed in Patent Literature 1, first, a wafer is fixed on a support plate via a double-sided adhesive tape. In that state, when the tape is stimulated after grinding or the like, a gas generated from the gas generating agent is emitted to the interface between the surfaces of the tape and the wafer, and the pressure of the gas causes at least partial detachment of the interface. The double-sided adhesive tape disclosed in Patent Literature 1 enables detachment without damaging the wafer or leaving the adhesive.

Along with the recent development of semiconductor chips with enhanced performance, wafers are more often subjected to a surface treatment such as a chemical, heating, or exothermic treatment. One of focused techniques for next generation is, for example, 3D stacking technology using through-Si vias (TSVs), in which a plurality of semiconductor chips are stacked to provide a compact device with remarkably high performance. TSVs can provide a high-density semiconductor package and can shorten the connection distance in a semiconductor to achieve low noise and low resistance. TSVs can also achieve remarkably high access speed and excellent release of the heat generated during use. Production of such TSVs requires treatments performed at high temperatures of 200° C. or higher, such as bumping a thin wafer obtained by grinding, forming bumps on the back side of the wafer, and reflowing during 3D stacking.

In the step of treating a wafer including these intensive treatments, a conventional method of treating a wafer as disclosed in Patent Literature 1 may cause reduction of adhesiveness due to the damage on the adhesive composition by a chemical treatment on the surface of the wafer, or may cause reduction of detachability because of enhanced adhesion of the adhesive composition due to high temperatures.

CITATION LIST

Patent Literature

Patent Literature 1: JP2003-231872 A

SUMMARY OF INVENTION

Technical Problem

In view of the above situation, the present invention aims to provide a method of treating a wafer in the state where the wafer is fixed on a support plate via an adhesive composition. Although the wafer is treated by a chemical, heating, or exothermic treatment, the method achieves sufficient adhesiveness during the step of treating the wafer and allows detachment of the support plate from the wafer without damaging the wafer or leaving the adhesive on the wafer after the wafer treating step.

Solution to Problem

The present invention provides a method of treating a wafer, including the steps of: fixing a wafer on a support plate via an adhesive composition containing a curable adhesive component to be crosslinked and cured by light irradiation or heating; crosslinking and curing the adhesive component by light irradiation or heating of the curable adhesive composition; treating a surface of the wafer fixed on the support plate by a chemical, heating, or exothermic treatment; and detaching the support plate from the treated wafer.

The present invention is described in detail below.

The method of treating a wafer of the present invention performs, first, fixing a wafer on a support plate via an adhesive composition containing a curable adhesive component to be crosslinked and cured by light irradiation or heating.

Fixing a wafer on a support plate enables easy handling and prevention of breakage of the wafer during wafer treatment.

The support plate may be any support plate that has sufficient strength, excellent heat resistance, and excellent chemical resistance and transmits or passes through light. Examples thereof include glass plates, quartz plates, and sapphire plates. The support plate may be a commercial product such as AF32 (available from Schott) or Borofloat 33 (available from Schott).

The adhesive composition contains a photocurable adhesive component to be crosslinked and cured by light irradiation or a thermosetting adhesive component to be crosslinked and cured by heating.

Examples of the photocurable adhesive component include photocurable adhesives that contain a polymerizable polymer as a main component and a photopolymerization initiator.

Examples of the thermosetting adhesive component include thermosetting adhesives that contain a polymerizable polymer as a main component and a thermal polymerization initiator.

The polymerizable polymer can be obtained by, for example, synthesizing a (meth)acrylic polymer containing a functional group in a molecule (hereinafter, referred to as a functional group-containing (meth)acrylic polymer), and then reacting the polymer with a compound that contains a radical polymerizable unsaturated bond and a functional group reactive with the above functional group in a molecule (hereinafter, referred to as a functional group-containing unsaturated compound).

The functional group-containing (meth)acrylic polymer, which is a polymer having adhesion at normal temperature, may be produced by the same method as in a common (meth)acrylic polymer. Specifically, the polymer is produced by copolymerization of a main monomer, a functional group-containing monomer, and optionally an additional modifying monomer copolymerizable with these monomers, by a common method. The main monomer may be an acrylic acid alkyl ester and/or a methacrylic acid alkyl ester, each of which contains an alkyl group normally containing 2 to 18 carbon atoms. The weight average molecular weight of the functional group-containing (meth)acrylic polymer is usually about 200000 to 2000000.

Examples of the functional group-containing monomer include carboxyl group-containing monomers such as acrylic acid and methacrylic acid; hydroxyl group-containing monomers such as hydroxyethyl acrylate and hydroxyethyl methacrylate; epoxy group-containing monomers such as glycidyl acrylate and glycidyl methacrylate; isocyanate group-containing monomers such as isocyanate ethyl acrylate and isocyanate ethyl methacrylate; and amino group-containing monomers such as aminoethyl acrylate and aminoethyl methacrylate.

Examples of the additional copolymerizable modifying monomer include various monomers used for common (meth)acrylic polymers, such as vinyl acetate, acrylonitrile, and styrene.

The functional group-containing unsaturated compound to be reacted with the functional group-containing (meth) acrylic polymer may be selected from the above mentioned functional group-containing monomers, according to the functional group of the functional group-containing (meth) acrylic polymer. For example, if the functional group of the functional group-containing (meth)acrylic polymer is a carboxyl group, an epoxy group-containing monomer or an isocyanate group-containing monomer may be used. If the functional group is a hydroxyl group, an isocyanate group-containing monomer may be used. If the functional group is an epoxy group, a carboxyl group-containing monomer or an amide group-containing monomer such as an acrylamide may be used. If the functional group is an amino group, an epoxy group-containing monomer may be used.

In the polymerizable polymer, a preferred lower limit of the amount of the radical polymerizable unsaturated bond is 0.01 meq/g, and a preferred upper limit thereof is 2.0 meq/g. If the amount of the radical polymerizable unsaturated bond in the polymerizable polymer falls in this range, the adhesive composition containing the curable adhesive component can have a controlled storage shear modulus at 25° C. of within the range of about $2.0 \times 10^5$ to $10^8$ Pa, as measured by dynamic viscoelasticity measurement under shear mode and continuous temperature rise from −50° C. to 300° C., after the step of crosslinking and curing the curable adhesive component by light irradiation or heating. Thus, the adhesive can be more effectively prevented from remaining on the surface of the wafer in the step of detaching the support plate from the wafer. A more preferred lower limit of the amount of the radical polymerizable unsaturated bond in the polymerizable polymer is 0.05 meq/g, and a more preferred upper limit thereof is 1.0 meq/g.

The photopolymerization initiator may be, for example, a photopolymerization initiator that is activated by irradiation with 250 to 800 nm wavelength light. Examples of such a photopolymerization initiator include acetophenone derivative compounds such as methoxy acetophenone; benzoin ether compounds such as benzoin propyl ether and benzoin isobutyl ether; ketal derivative compounds such as benzyl dimethyl ketal and acetophenone diethyl ketal; phosphine oxide derivative compounds; and bis(η5-cyclopentadienyl) titanocene derivative compounds, benzophenone, Michler's ketone, chlorothioxanthone, dodecylthioxanthone, dimethylthioxanthone, diethylthioxanthone, α-hydroxy cyclohexyl phenyl ketone, and 2-hydroxymethylphenylpropane. These photopolymerization initiators may be used alone or in combination of two or more thereof.

The thermal polymerization initiator may be a thermal polymerization initiator that is decomposed by heating and thereby generates an active radical that initiates polymerization. Examples thereof include dicumyl peroxide, di-t-butyl peroxide, t-butyl peroxy benzoate, t-butyl hydroperoxide, benzoyl peroxide, cumene hydroperoxide, diisopropyl benzene hydroperoxide, paramenthane hydroperoxide, and di-t-butyl peroxide. These thermal polymerization initiators may be used alone or in combination of two or more thereof.

The photocurable adhesive and the thermosetting adhesive each preferably further contain a radical polymerizable polyfunctional oligomer or monomer. The radical polymerizable polyfunctional oligomer or monomer leads to improved photocurability or thermosetting properties.

The polyfunctional oligomer or monomer has a molecular weight of preferably 10000 or less. More preferably, the molecular weight is 5000 or less and the number of radical polymerizable unsaturated bonds in a molecule is 2 to 20 for efficient three-dimensional reticulation of the adhesive layer by heating or light irradiation.

Examples of the polyfunctional oligomer and monomer include trimethylolpropane triacrylate, tetramethylol methane tetraacrylate, pentaerythritol triacrylate, pentaerythritol tetraacrylate, dipentaerythritol monohydroxy pentaacrylate, dipentaerythritol hexaacrylate, and similar methacrylates as these. In addition, 1,4-butyleneglycol diacrylate, 1,6-hexanediol diacrylate, polypropylene glycol #700 diacrylate, polyethyleneglycol diacrylate, commercially available oligoester acrylate, and similar methacrylates as these. These polyfunctional oligomers and monomers may be used alone or in combination of two or more thereof.

The photocurable adhesive and the thermosetting adhesive may each contain a gas generating agent that generates a gas by stimulation. The photocurable or thermosetting adhesive containing such a gas generating agent enables easier detachment of the support plate from the wafer without leaving the adhesive by stimulating the treated wafer to generate a gas from the gas generating agent in the below mentioned step of detaching the support plate.

The combination of the photocurable or thermosetting adhesive component and the gas generating agent is selected such that the light or heat for crosslinking and curing the photocurable or thermosetting adhesive component is qualitatively or quantitatively different from the stimulus for generating a gas from the gas generating agent. Such a combination can prevent detachment of the wafer from the support plate by a gas generated by light irradiation or heating in the below mentioned step of curing and crosslinking the adhesive component. Specifically, a gas generating agent that generates a gas by a stimulus other than light, such as heat, may be selected. Even if a gas generating agent that generates a gas by light irradiation is used along with the photocurable adhesive component, a gas generating agent that generates a gas by light having a wavelength different from the light for crosslinking and curing the photocurable adhesive component may be used. Even if a gas generating agent that generates a gas by light having the same wavelength as that of the light for crosslinking and curing the photocurable adhesive component is used, a gas generating agent that requires a larger amount of light than the photocurable adhesive component may be selected, for example.

Specifically, if the photocurable adhesive component is used, a gas generating agent that generates a gas by a stimulus other than light, such as heat, may be selected. If the stimulus for generating a gas from the gas generating agent is also light, usable is a gas generating agent that generates a gas by light having a wavelength different from the light for crosslinking and curing the photocurable adhesive component. If a gas generating agent that generates a gas by light having the same wavelength as that of the light for crosslinking and curing the photocurable adhesive component is used, usable is a gas generating agent that generates a gas by light in a larger amount light than the photocurable adhesive component.

For example, if the photocurable adhesive component to be crosslinked and cured by light irradiation contains an adhesive, which contains a polymer that contains an unsaturated double bond such as a vinyl group in the side chain and a photopolymerization initiator that is activated by 250 to 800 nm wavelength light, the component can be crosslinked and cured by irradiation with 365 nm or longer wavelength light. If such a photocurable adhesive component is combined with a gas generating agent that generates a gas by irradiation with 300 nm or shorter wavelength light, the light irradiation can be performed with 365 nm or longer wavelength light in the step of curing and crosslinking the adhesive component and with 300 nm or shorter wavelength light in the step of detaching the support plate.

If the thermosetting adhesive component is used, a gas generating agent that generates a gas by a stimulus other than heat, such as light, may be selected. Even if the stimulus for generating a gas from the gas generating agent is also heat, a thermosetting adhesive component that is crosslinked and cured at a temperature lower than the temperature at which the gas generating agent generates a gas may be selected.

For example, if a thermosetting adhesive, which contains a polymer that contains an unsaturated double bond such as a vinyl group in the side chain and a thermal polymerization initiator that is activated by heating at about 50° C. to 150° C., is combined with a gas generating agent that generates a gas by heating at 200° C. or higher, the heating can be performed at 50° C. to 150° C. in the step of curing and crosslinking the adhesive component and at 200° C. or higher in the step of detaching the support plate.

The gas generating agent is not particularly limited and may be a well known gas generating agent such as an azo compound or an azide compound.

A carboxylic acid compound represented by the following formula (1) and a salt thereof are also suitable because these compounds do not cause detachment by a chemical, heating, or exothermic treatment, namely, have excellent resistance to these treatments. Such a gas generating agent generates a gas (carbon dioxide gas) by irradiation with light such as ultraviolet light and has high heat resistance that prevents decomposition under high temperatures of about 200° C. Such a gas generating agent also has excellent resistance to acids, alkalis, and chemicals such as organic solvent, and does not cause reaction to generate a gas even in the below mentioned intensive step of treating a surface of the wafer.

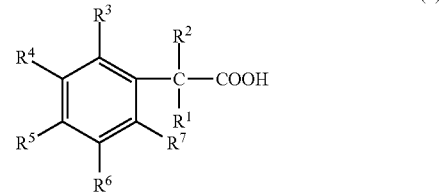

(1)

In the formula (1), $R^1$ to $R^7$ each represent hydrogen or an organic group. $R^1$ to $R^7$ may be the same as or different from one another. Two of $R^1$ to $R^7$ may be bonded to each other to form a cyclic structure.

Examples of the organic group in the formula (1) include alkyl groups such as methyl, ethyl, propyl, butyl, and isobutyl groups; alkoxy groups such as methoxy and ethoxy groups; carboxyl groups; hydroxyl groups; nitro groups; aromatic groups such as phenyl groups; polycyclic hydrocarbon groups such as naphthyl, fluorenyl, and pyrenyl groups; ring-assembly hydrocarbon groups such as biphenyl group; and heterocyclic groups such as xanthenyl group.

Preferably, one of $R^3$ to $R^7$ in the formula (1) is an organic group represented by the following formula (2), or adjacent two of $R^3$ to $R^7$ in the formula (1) are bonded to each other to form a cyclic structure represented by the following formula (3).

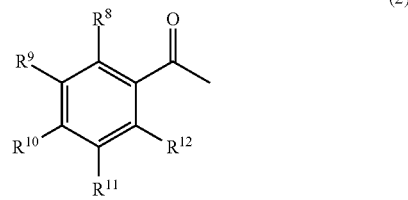

(2)

(3)

In the formula (2), $R^8$ to $R^{12}$ each represent hydrogen or an organic group. $R^8$ to $R^{12}$ may be the same as or different from one another. Two of $R^8$ to $R^{12}$ may be bonded to each other to form a cyclic structure.

In the formula (3), $R^{13}$ to $R^{16}$ each represent hydrogen or an organic group. $R^{13}$ to $R^{16}$ may be the same as or different from one another. Two of $R^{13}$ to $R^{16}$ may be bonded to each other to form a cyclic structure.

$R^1$ in the formula (1) is preferably a methyl group.

Specific examples of the carboxylic acid compound represented by the formula (1) include phenylacetic acid, diphenylacetic acid, triphenylacetic acid, 2-phenylpropionic acid, 2,2-diphenylpropionic acid, 2,2,2-triphenylpropionic acid, 2-phenylbutyl acid, α-methoxyphenylacetic acid, mandelic acid, atrolactic acid, benzylic acid, tropic acid, phenylmalonic acid, phenylsuccinic acid, 3-methyl-2-phenylbutyric acid, o-toluic acetic acid, m-toluic acetic acid, 4-isobutyl-α-methylphenylacetic acid, p-toluic acetic acid, 1,2-phenylenediacetic acid, 1,3-phenylenediacetic acid, 1,4-phenylenediacetic acid, 2-methoxyphenylacetic acid, 2-hydroxy phenylacetic acid, 2-nitrophenylacetic acid, 3-nitrophenylacetic acid, 4-nitrophenylacetic acid, 2-(4-nitrophenyl)propionic acid, 3-(4-nitrophenyl)propionic acid, 4-(4-nitrophenyl)propionic acid, 3,4-dimethoxyphenylacetic acid, 3,4-(methylenedioxy)phenylacetic acid, 2,5-dimethoxyphenylacetic acid, 3,5-dimethoxyphenylacetic acid, 3,4,5-trimethoxyphenylacetic acid, 2,4-dinitrophenylacetic acid, 4-biphenylacetic acid, 1-naphthylacetic acid, 2-naphthylacetic acid, 6-methoxy-α-methyl-2-naphthylacetic acid, 1-pyreneacetic acid, 9-fluorenecarboxylic acid, and 9H-xanthene-9-carboxylic acid.

The carboxylic acid compound represented by the formula (1) is preferably ketoprofen represented by the following formula (1-1) or 2-xanthoneacetic acid represented by the following formula (1-2).

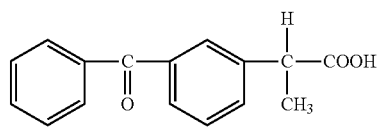

(1-1)

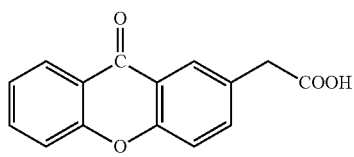

(1-2)

A salt of the carboxylic acid compound represented by the formula (1), which has a structure derived from the carboxylic acid compound represented by the formula (1), can also easily cause decarboxylation by light irradiation and thereby generate carbon dioxide gas.

The salt of the carboxylic acid compound represented by the formula (1) may be easily prepared without any complicated synthesis route, by mixing the carboxylic acid compound represented by the formula (1) and a basic compound in a container.

The basic compound is not particularly limited and examples thereof include amines, hydrazine compounds, quaternary ammonium hydroxide salts, and phosphine compounds.

The amines are not particularly limited and may be any of primary, secondary, and tertiary amines.

Among these, monoalkyl amines and dialkyl amines are suitable for the basic compound. Using a monoalkyl or dialkyl amine can reduce the polarity of the resulting salt of the carboxylic acid compound represented by the formula (1) and thus can increase the solubility with the adhesive component. $C_{6-12}$ monoalkyl or dialkyl amines are more preferred.

The gas generating agent may also be a tetrazole compound represented by the following formula (4), (5), or (6), or a salt thereof. These gas generating agents also generate a gas (nitrogen gas) by irradiation with light such as ultraviolet light and have high heat resistance that prevents decomposition under high temperatures of about 200° C. These gas generating agents also have excellent resistance to acids, alkalis, and chemicals such as organic solvent, and do not cause reaction to generate a gas in the below mentioned intensive step of treating a surface of the wafer.

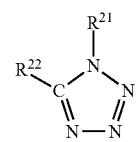

(4)

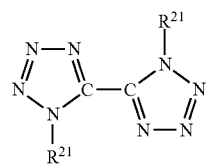

(5)

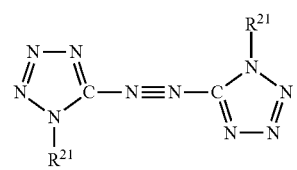

(6)

In the formulas (4) to (6), $R^{21}$s and $R^{22}$ each represent hydrogen, a $C_{1-7}$ alkyl group, an alkylene group, a phenyl group, a mercapto group, a hydroxyl group, or an amino group.

Salts of the tetrazole compounds represented by the formulas (4) to (6), which also have a structure derived from one of the tetrazole compounds represented by the formulas (4) to (6), can generate nitrogen gas by light irradiation.

The salts of the tetrazole compounds represented by the formulas (4) to (6) are not particularly limited and examples thereof include sodium salts, potassium salts, and ammonium salts.

The salts of the tetrazole compounds represented by the formulas (4) to (6) may be easily prepared without any complicated synthesis route, by mixing one of the tetrazole compounds represented by the formulas (4) to (6) and a basic compound in a container.

The basic compound is not particularly limited, and examples thereof include amines, hydrazine compounds, quaternary ammonium hydroxide salts, and phosphine compounds.

The amines are not particularly limited and may be any of primary, secondary, and tertiary amines.

Among these, monoalkyl amines and dialkyl amines are suitable for the basic compound. Using a monoalkyl or dialkyl amine can reduce the polarity of the resulting salt of the tetrazole compound represented by one of the formulas (4) to (6) and thus can increase the solubility with the photocurable adhesive component. $C_{6-12}$ monoalkyl or dialkyl amines are more preferred.

The tetrazole compound represented by the formula (4) and a salt thereof are not particularly limited, and specific examples thereof include 1H-tetrazole, 5-phenyl-1H-tetrazole, 5,5-azobis-1H-tetrazole, 5-amino-1H-tetrazole, 5-methyl-1H-tetrazole, 1-methyl-5-mercapto-1H-tetrazole, 1-methyl-5-ethyl-1H-tetrazole, and 1-(dimethylaminoethyl)-5-mercapto-1H-tetrazole.

The tetrazole compound represented by the formula (5) and a salt thereof are not particularly limited, and specific examples thereof include 5,5'-bistetrazole diammonium salt.

The tetrazole compound represented by the formula (6) and a salt thereof are not particularly limited, and specific examples thereof include 5,5'-bistetrazoleamine monoammonium salt.

A preferred lower limit of the amount of the gas generating agent is 5 parts by weight for 100 parts by weight of the photocurable or thermosetting adhesive component, and a preferred upper limit thereof is 50 parts by weight. Less than 5 parts by weight of the gas generating agent may reduce the amount of carbon dioxide gas or nitrogen gas generated by stimulation and thereby may prevent sufficient detachment. More than 50 parts by weight of the gas generating agent may cause insufficient dissolution in the photocurable or thermosetting adhesive component and thereby may reduce adhesiveness. A more preferred lower limit of the amount of the gas generating agent is 10 parts by weight, a more preferred upper limit thereof is 30 parts by weight.

The adhesive composition may further contain a photosensitizer.

The photosensitizer has an effect of amplifying the light stimulus to the gas generating agent, and thus enables gas emission with a smaller amount of light. The photosensitizer also enables gas emission by light with a wider wavelength range.

The photosensitizer may be any photosensitizer having excellent heat resistance.

Examples of the photosensitizer having excellent heat resistance include polycyclic aromatic compounds containing at least one alkoxy group. In particular, substituted alkoxy polycyclic aromatic compounds in which an alkoxy group is partially substituted with a glycidyl group or hydroxyl group are suitable. These photosensitizers have high sublimation resistance and thus can be used under high temperatures. Partial substitution of the alkoxy group with a glycidyl group or hydroxyl group increases the solubility in the photocurable adhesive component and thus can prevent bleed out.

The polycyclic aromatic compound is preferably an anthracene derivative. The alkoxy group is preferably a $C_{1-18}$ alkoxy group, more preferably a $C_{1-8}$ alkoxy group.

Examples of the polycyclic aromatic compound containing at least one alkoxy group include anthracene derivatives such as 9,10-dimethoxyanthracene, 2-ethyl-9,10-dimethoxyanthracene, 2-t-butyl-9,10-dimethoxyanthracene, 2,3-dimethyl-9,10-dimethoxyanthracene, 9-methoxy-10-methylanthracene, 9,10-diethoxyanthracene, 2-ethyl-9,10-diethoxyanthracene, 2-t-butyl-9,10-diethoxyanthracene, 2,3-dimethyl-9,10-diethoxyanthracene, 9-ethoxy-10-methylanthracene, 9,10-dipropoxyanthracene, 2-ethyl-9,10-dipropoxyanthracene, 2-t-butyl-9,10-dipropoxyanthracene, 2,3-dimethyl-9,10-dipropoxyanthracene, 9-isopropoxy-10-methylanthracene, 9,10-dibutoxyanthracene, 9,10-dibenzyloxyanthracene, 2-ethyl-9,10-dibenzyloxyanthracene, 2-t-butyl-9,10-dibenzyloxyanthracene, 2,3-dimethyl-9,10-dibenzyloxyanthracene, 9-benzyloxy-10-methylanthracene, 9,10-di-α-methylbenzyloxyanthracene, 2-ethyl-9,10-di-α-methylbenzyloxyanthracene, 2-t-butyl-9,10-di-α-methylbenzyloxyanthracene, 2,3-dimethyl-9,10-di-α-methylbenzyloxyanthracene, 9-(α-methylbenzyloxy)-10-methylanthracene, 9,10-di(2-hydroxyethoxy)anthracene, and 2-ethyl-9,10-di(2-carboxyethoxy)anthracene.

Examples of the substituted alkoxy polycyclic aromatic compound in which an alkoxy group is partially substituted with a glycidyl group or hydroxyl group include 9,10-di(glycidyloxy)anthracene, 2-ethyl-9,10-di(glycidyloxy)anthracene, 2-t-butyl-9,10-di(glycidyloxy)anthracene, 2,3-dimethyl-9,10-di(glycidyloxy)anthracene, 9-(glycidyloxy)-10-methylanthracene, 9,10-di(2-vinyloxyethoxy)anthracene, 2-ethyl-9,10-di(2-vinyloxyethoxy)anthracene, 2-t-butyl-9,10-di(2-vinyloxyethoxy)anthracene, 2,3-dimethyl-9,10-di(2-vinyloxyethoxy)anthracene, 9-(2-vinyloxyethoxy)-10-methylanthracene, 9,10-di(3-methyl-3-oxetanylmethoxy)anthracene, 2-ethyl-9,10-di(3-methyl-3-oxetanylmethoxy)anthracene, 2-t-butyl-9,10-di(3-methyl-3-oxetanylmethoxy)anthracene, 2,3-dimethyl-9,10-di(3-methyl-3-oxetanylmethoxy)anthracene, 9-(3-methyl-3-oxetanylmethoxy)-10-methylanthracene, 9,10-di(p-epoxyphenylmethoxy)anthracene, 2-ethyl-9,10-di(p-epoxyphenylmethoxy)anthracene, 2-t-butyl-9,10-di(p-epoxyphenylmethoxy)anthracene, 2,3-dimethyl-9,10-di(p-epoxyphenylmethoxy)anthracene, 9-(p-epoxyphenylmethoxy)-10-methylanthracene, 9,10-di(p-vinylphenylmethoxy)anthracene, 2-ethyl-9,10-di(p-vinylphenylmethoxy)anthracene, 2-t-butyl-9,1-di(p-vinylphenylmethoxy)anthracene, 2,3-dimethyl-9,10-di(p-vinylphenylmethoxy)anthracene, 9-(p-vinylphenylmethoxy)-10-methylanthracene, 9,10-di(2-hydroxyethoxy)anthracene, 9,10-di(2-hydroxypropoxy)anthracene, 9,10-di(2-hydroxybutoxy)anthracene, 9,10-di(2-hydroxy-3-butoxypropoxy)anthracene, 9,10-di(2-hydroxy-3-(2-ethylhexyloxyl)propoxy)anthracene, 9,10-di(2-hydroxy-3-allyloxypropoxy)anthracene, 9,10-di(2-hydroxy-3-phenoxypropoxy)anthracene, and 9,10-di(2,3-dihydroxypropoxy)anthracene.

A preferred lower limit of the amount of the photosensitizer is 0.05 parts by weight for 100 parts by weight of the photocurable or thermosetting adhesive component, and a preferred upper limit thereof is 10 parts by weight. Less than 0.05 parts by weight of the photosensitizer may fail to provide sufficient sensitizing effect. More than 10 parts by weight of the photosensitizer may increase the amount of residue derived from the photosensitizer and thereby may prevent sufficient detachment. A more preferred lower limit of the amount of photosensitizer is 0.1 parts by weight, and a more preferred upper limit thereof is 5 parts by weight.

The adhesive composition may contain fumed silica. Blending fumed silica increases the cohesive force of the adhesive composition. Thus, even if the functional group-containing (meth)acrylic polymer is mixed with an additive having a different polarity, the adhesive composition can be a uniform composition without separation. The tensile strength of the composition is also significantly improved. Thus, even after chemical treatment or high-temperature treatment at 200° C. or higher, the stress given by detachment does not break the adhesive, and the detachment thus can be accomplished without leaving the adhesive.

The lower limit of the average particle size of the fumed silica is 0.05 μm, and the upper limit thereof is 3 μm. The fumed silica having an average particle size within this range can impart high chemical resistance and heat resistance to the adhesive composition. Namely, defects such as a partial detachment do not occur, even after a chemical treatment or high-temperature treatment at 200° C. or higher. The fumed silica having such an average particle size can also impart an excellent property of leaving no adhesive to the adhesive composition. Namely, the adhesive does not remain on the wafer, even after detachment after the chemical treatment or high-temperature treatment at 200° C. or higher. A preferred lower limit of the average particle size of the fumed silica is 0.06 μm, and a preferred upper limit thereof is 2 μm. A more preferred lower limit thereof is 0.07 μm, and a more preferred upper limit thereof is 1 μm.

The average particle size of fumed silica herein means the particle size of fumed silica before blending, which is dispersed in a solvent such as methyl ethyl ketone or a solution of methyl ethyl ketone/toluene (60:40), measured by laser scattering diffraction method or dynamic light scattering method.

In the case of blending the fumed silica, the amount thereof is preferably 40 parts by weight or less for 100 parts by weight of the photocurable or thermosetting adhesive component. The fumed silica in an amount of not more than 40 parts by weight can achieve the effect of improving the cohesive force, providing a uniform adhesive composition and improving the property of leaving no adhesive. The lower limit of the amount of the fumed silica is not particularly limited, but the amount thereof is preferably 3 parts by weight or more for sufficiently achieving the effects of providing the uniform adhesive composition and improving the property of leaving no adhesive.

The adhesive composition may contain a silicone compound that contains a functional group crosslinkable with the photocurable or thermosetting adhesive component (hereinafter, also simply referred to as a "silicone compound A").

The silicone compound, which has excellent chemical resistance and heat resistance, can prevent troubles such as scorching of the adhesive even after a chemical treatment or a high-temperature treatment at 200° C. or higher, and bleeds out at the interface of the adhered object in detachment, to achieve easy detachment. The silicone compound, which contains a functional group crosslinkable with the photocurable or thermosetting adhesive component, chemically reacts with the photocurable or thermosetting adhesive component by light irradiation or heating and thereby is incorporated into the photocurable or thermosetting adhesive component. Thus, the silicone compound is prevented from adhering to the adhered object and contaminating the adhered object. Blending the silicone compound enhances the affinity to the support plate and thereby achieves the effect of preventing the adhesive from remaining on the wafer.

The silicone structure of the silicone compound A is not particularly limited and may contain a D unit or DT unit.

The silicone compound A contains the functional group preferably in the side chain or at terminal of the silicone structure.

In particular, a silicone compound that has a D unit silicone structure and contains a functional group crosslinkable with the photocurable or thermosetting adhesive component at terminal is more preferred because such a silicone compound tends to achieve both high initial adhesiveness and detachability after a chemical treatment or high-temperature treatment at 200° C. or higher.

The functional group of the silicone compound A may be appropriately selected according to the photocurable or thermosetting adhesive component. For example, if the photocurable or thermosetting adhesive component mainly contains a (meth)acrylic acid alkyl ester-type polymerizable polymer containing a radical polymerizable unsaturated bond in a molecule, a functional group crosslinkable with a (meth)acrylic group is selected.

The functional group crosslinkable with a (meth)acrylic group contains an unsaturated double bond, and specific examples of the functional group include vinyl, (meth)acryl, allyl, and maleimide groups.

The functional equivalent in the silicone compound A is not particularly limited, but a preferred lower limit is 1 and a preferred upper limit is 20. If the functional equivalent is less than 1, the silicone compound A may not be sufficiently incorporated into the photocurable adhesive component in the curing of the resulting adhesive composition, which may cause contamination of the adhered object or insufficient detachability. If the equivalent thereof is more than 20, the adhesive composition may fail to achieve sufficient adhesiveness. A more preferred upper limit of the functional equivalent is 10, a more preferred lower limit thereof is 2, and a still more preferred upper limit thereof is 6.

The molecular weight of the silicone compound A is not particularly limited, but a preferred lower limit is 300 and a preferred upper limit is 50000. Less than 300 of the molecular weight thereof may cause the resulting adhesive composition to have insufficient chemical resistance and heat resistance. More than 50000 of the molecular weight thereof may make it difficult to be mixed with the photocurable or thermosetting adhesive component. The lower limit of the molecular weight thereof is more preferably 400, still more preferably 500. The upper limit thereof is more preferably 10000, still more preferably 5000.

The silicone compound A may be synthesized by any method, such as a method by hydrosilylation reaction of a SiH group-containing silicone resin with a vinyl compound containing a functional group crosslinkable with the photocurable or thermosetting adhesive component to introduce the functional group crosslinkable with the photocurable or thermosetting adhesive component into the silicone resin; or a method by condensation reaction of a siloxane compound with a siloxane compound containing a functional group crosslinkable with the photocurable or thermosetting adhesive component.

Examples of commercially available silicone compound A include silicone compounds containing a methacrylic group at each end, such as X-22-164, X-22-164AS, X-22-164A, X-22-164B, X-22-164C, and X-22-164E available from Shin-Etsu Chemical Co., Ltd.; silicone compounds containing a methacrylic group at one end, such as X-22-174DX, X-22-2426, and X-22-2475 available from Shin-Etsu Chemical Co., Ltd.; acrylic group-containing silicone compounds such as EBECRYL 350 and EBECRYL 1360 available from DAICEL-ALLNEX LTD.; acryl group-containing silicone compounds such as AC-SQ TA-100 and AC-SQ SI-20 available from Toagosei Co., Ltd.; and methacrylic group-containing silicone compounds such as MAC-SQ TM-100, MAC-SQ SI-20, and MAC-SQ HDM available from Toagosei Co., Ltd.

Among these, silicone compounds that contain a (meth)acrylic group in the siloxane structure, represented by the following formulas (I), (II), and (III) are suitable as the silicone compound A because such silicone compounds have particularly high chemical resistance and heat resistance, and also have high polarity to easily bleed out from the adhesive composition.

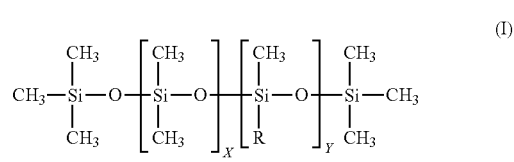

(I)

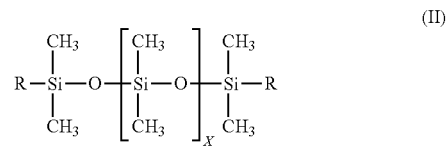

(II)

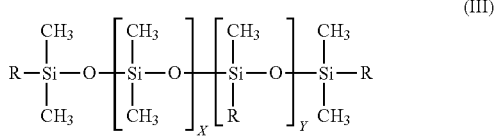

(III)

In each formula, X and Y each represent an integer of 0 to 1200 (except for the case where both X and Y are 0), and Rs each represent a functional group containing an unsaturated double bond.

Examples of commercially available products of the silicone compound containing a (meth)acrylic group in the siloxane structure, represented by the formulas (I), (II), and (III), include EBECRYL 350 and EBECRYL 1360 (R represents an acrylic group in both products) available from DAICEL-ALLNEX LTD.

A preferred lower limit of the amount of the silicone compound A is 0.5 parts by weight for 100 parts by weight of the photocurable or thermosetting adhesive component, and a preferred upper limit thereof is 50 parts by weight. Less than 0.5 parts by weight of the silicone compound A may fail to sufficiently reduce the adhesiveness after light irradiation or heating, possibly preventing detachment of the adhesive compound from the adhered object. More than 50 parts by weight of the silicone compound A may contaminate the adhered object. A more preferred lower limit of the amount of the silicone compound A is 1 part by weight, and a more preferred upper limit thereof is 40 parts by weight.

The adhesive composition may optionally contain various polyfunctional compounds to be blended with general adhesives, such as isocyanate compounds, melamine compounds, and epoxy compounds, for adjusting the cohesive force of the adhesive.

The adhesive composition may contain known additives such as plasticizer, resin, surfactant, wax, and fine-particle filler.

In the step of fixing a wafer on a support plate, the wafer and the support plate may be directly bonded with the adhesive composition, or may be bonded with a double-sided adhesive tape that includes an adhesive layer formed from the adhesive composition on at least one surface.

The double-sided adhesive tape may be a support tape that has an adhesive layer at each surface of a substrate, or a non-support tape that does not have a substrate.

If the double-sided adhesive tape is a support tape, examples of the substrate include a sheet formed from a transparent resin such as acryl, olefin, polycarbonate, vinyl chloride, ABS, polyethylene terephthalate (PET), nylon, urethane, and polyimide; a mesh sheet; and a sheet with holes.

Next, the method of treating a wafer of the present invention performs crosslinking and curing the curable adhesive component by light irradiation or heating.

The curable adhesive component crosslinked and cured by light irradiation or heating has significantly improved chemical resistance. The adhesive thus does not seep into the chemicals even during a chemical treatment on the surface of a wafer. Moreover, the crosslinked and cured curable adhesive component has increased modulus of elasticity and thus is less likely to enhance the adhesiveness even at high temperatures. The detachability of the adhesive composition is thus not reduced in the step of detaching the support plate. Furthermore, if the gas generating agent generates a gas in the hard curable adhesive component that is crosslinked and cured and has an increased modulus of elasticity, the generated gas is mostly emitted outside. The emitted gas causes at least partial detachment of the adhesive-bonded surface of the adhered object to reduce the adhesiveness. Such easy detachment may achieve a short takt time.

As mentioned above, although the method of the present invention includes the step of treating a surface of the wafer by a chemical, heating, or exothermic treatment, the step of curing and crosslinking the adhesive component before the step of treating a surface of the wafer achieves sufficient adhesiveness during the step of treating a surface of the wafer and allows detachment of the support plate from the wafer without damaging or leaving the adhesive on the wafer after the step of treating a surface of the wafer.

For example, if the photocurable adhesive component to be crosslinked and cured by light irradiation is an adhesive that contains a polymer, which contains an unsaturated double bond such as a vinyl group in the side chain, and a photopolymerization initiator, which is activated by 250 to 800 nm wavelength light, the photocurable adhesive component can be crosslinked and cured by irradiation with 365 nm or longer wavelength light.

Such a photocurable adhesive component is irradiated with 365 nm wavelength light at an illuminance of preferably 5 mW or more, more preferably 10 mW or more, still more preferably 20 mW or more, particularly preferably 50 mW or more. Also, such a photocurable adhesive component is irradiated with 365 nm wavelength light at an integrated illuminance of preferably 300 mJ or more, more preferably 500 mJ or more and 10000 mJ or less, still more preferably 500 mJ or more and 7500 mJ or less, particularly preferably 1000 mJ or more and 5000 mJ or less.

If the thermosetting adhesive component to be crosslinked and cured by heating is an adhesive which contains a polymer that contains an unsaturated double bond such as a vinyl group in the side chain and a thermal polymerization initiator that is activated by heating at about 50° C. to 150° C., the thermosetting adhesive component can be crosslinked and cured by heating at about 50° C. to 150° C.

In the adhesive composition, a preferred lower limit of the storage shear modulus at 25° C. is $2.0 \times 10^5$ Pa, as measured by dynamic viscoelasticity measurement under shear mode and continuous temperature rise from −50° C. to 300° C. after the step of crosslinking and curing the curable adhesive component, and a preferred upper limit thereof is $10^8$ Pa. The storage shear modulus within this range can prevent unintended detachment of the wafer from the support plate during the step of treating a surface of the wafer and also can prevent the adhesive from remaining on the surface of the wafer in the step of detaching the support plate from the wafer. A more preferred lower limit of the storage shear modulus is $1.0 \times 10^6$ Pa, and a more preferred upper limit thereof is $5.0 \times 10^7$ Pa.

Next, the method of treating a wafer of the present invention performs treating a surface of the wafer fixed on the support plate by a chemical, heating, or exothermic treatment.

The chemical treatment is not particularly limited as long as an acid, alkali, or organic solvent is used. Examples thereof include plating treatment such as electrolytic plating and non-electrolytic plating; wet etching treatment using hydrofluoric acid, an aqueous solution of tetramethylammonium hydroxide (TMAH), and the like; resist removing process using N-methyl-2-pyrrolidone, monoethanolamine, DMSO, and the like; and washing process using concentrated sulfuric acid, ammonia water, a hydrogen peroxide solution, and the like.

Examples of the heating treatment and exothermic treatment include sputtering, vapor deposition, etching, chemical vapor deposition (CVD), physical vapor deposition (PVD), resist applying and patterning, and reflowing.

The step of treating a surface of the wafer in the present invention may include, before the below mentioned step of detaching the support plate, applying a dicing tape to the treated surface of the wafer after the above treatment. Applying a dicing tape in advance enables immediate shift to dicing after the step of detaching the support plate.

Next, the method of treating a wafer of the present invention performs detaching the support plate from the treated wafer. Since the curable adhesive component has been crosslinked and cured in the step of curing and crosslinking the adhesive component, the support plate can be relatively easily detached from the wafer without leaving the adhesive.

If the adhesive composition contains the gas generating agent, the support plate can be more easily detached from the wafer by stimulating the treated wafer and thereby generating a gas from the gas generating agent in the step of detaching the support plate.

For example, if the gas generating agent generates a gas by irradiation with 300 nm or shorter wavelength light, the support plate can be easily detached from the wafer by irradiating with 300 nm or shorter wavelength light and thereby generating a gas from the gas generating agent.

Such a gas generating agent is, for example, irradiated with 254 nm wavelength light at an illuminance of preferably 5 mW or more, more preferably 10 mW or more, still more preferably 20 mW or more, particularly preferably 50 mW or more. Also, such a gas generating agent is irradiated with 254 nm wavelength light at an integrated illuminance of preferably 1000 mJ or more, more preferably 1000 mJ or more and 20 J or less, still more preferably 1500 mJ or more and 15 J or less, particularly preferably 2000 mJ or more and 10 J or less.

If the gas generating agent generates a gas by heating at 200° C. or higher, the support plate can be easily detached from the wafer by heating at 200° C. or higher and thereby generating a gas from the gas generating agent.

Advantageous Effects of Invention

The present invention provides a method of treating a wafer in the state where the wafer is fixed on a support plate via an adhesive composition. Although the wafer is treated by a chemical, heating, or exothermic treatment, this method achieves sufficient adhesiveness during the step of treating a surface of the wafer and allows detachment of the support plate from the wafer without damaging the wafer or leaving the adhesive on the wafer after the wafer treating step.

DESCRIPTION OF EMBODIMENTS

Some aspects of the present invention are described in more detail below referring to examples which do not intend to limit the present invention.

(Synthesis of Resins A to L)

A reactor equipped with a thermometer, a stirrer, and a condenser tube was prepared and charged with 2-ethylhexyl acrylate (94 parts by weight) as a (meth)acrylic acid alkyl ester, hydroxyethyl methacrylate (6 parts by weight) as a functional group-containing monomer, lauryl mercaptan (0.01 parts by weight), and ethyl acetate (80 parts by weight). The reactor was heated and thereby was refluxed. Then, to the reactor was added 1,1-bis(t-hexylperoxy)-3,3,5-trimethylcyclohexane (0.01 parts by weight) as a polymerization initiator, whereby the polymerization was started under reflux. At one hour and at two hours from the starting of the polymerization, 1,1-bis(t-hexylperoxy)-3,3,5-trimethylcyclohexane (0.01 parts by weight) was further added to the reactor. At four hours from the starting of the polymerization, t-hexylperoxy pivalate (0.05 parts by weight) was added thereto, and the polymerization reaction was continued. At eight hours from the starting of the polymerization, an ethyl acetate solution of a functional group-containing (meth)acrylic polymer having a solids content of 55% by weight and a weight average molecular weight of 600000 was obtained.

Subsequently, 3.5 parts by weight of 2-isocyanatoethyl methacrylate as a functional group-containing unsaturated compound was added for 100 parts by weight of the resin solids content of the obtained ethyl acetate solution of a functional group-containing (meth)acrylic polymer, whereby the mixture was reacted. Thus, a photocurable adhesive (resin A) was obtained.

Resins B to L were synthesized in the same manner as in the synthesis of the resin A except that the materials shown in Table 1 were used as the (meth)acrylic acid alkyl ester, functional group-containing monomer, and functional group-containing unsaturated compound. In resin I, pentaerythritol triacrylate (5 parts by weight) was also used as a polyfunctional oligomer and the polymerization was initiated.

TABLE 1

| | Functional group-containing (meth)acrylic polymer | | | | | | | | | |
|---|---|---|---|---|---|---|---|---|---|---|
| | Amont of monomer (parts by weight) | | | | | | | Amount of functional group-containing unsaturated compound (for 100 parts by weight of the resin solids content of the functional group-containing (meth)acrylic polymer) | | |
| | Acrylic acid alkyl ester | Functional group-containing monomer | | | Polyfunctional oligomer | Amount of radical | Weight average | | | |
| | 2-Ethylhexyl acrylate | Hydroxyethyl methacrylate | Acrylic acid | Glycidyl methacrylate | Isocyanate ethyl acrylate | Pentaerythritol triacrylate | polymerizable unsaturated bond (meq/g) | molecular weight (×10000) | 2-Isocyanatoethyl methacrylate | Glycidyl methacrylate | Hydroxyethyl methacrylate |
| Resin A | 94 | 6 | — | — | — | — | 0.30 | 60 | 3.5 | — | — |
| Resin B | 90 | 10 | — | — | — | — | 0.30 | 85 | 3.5 | — | — |
| Resin C | 80 | 20 | — | — | — | — | 0.15 | 85 | 1.5 | — | — |
| Resin D | 80 | 20 | — | — | — | — | 0.40 | 90 | 5 | — | — |
| Resin E | 80 | 20 | — | — | — | — | 0.70 | 82 | 10 | — | — |

TABLE 1-continued

| | Functional group-containing (meth)acrylic polymer | | | | | | | | | |
|---|---|---|---|---|---|---|---|---|---|---|
| | Amount of monomer (parts by weight) | | | | | | | Amount of functional group-containing unsaturated compound (for 100 parts by weight of the resin solids content of the functional group-containing (meth)acrylic polymer) | | |
| | Acrylic acid alkyl ester | Functional group-containing monomer | | | Poly-functional oligomer | Amount of radical | Weight average | | | |
| | 2-Ethyl-hexyl acrylate | Hydroxy-ethyl meth-acrylate | Acrylic acid | Glycidyl meth-acrylate | Iso-cyanate ethyl acrylate | Penta-erythritol triacrylate | polymerizable unsaturated bond (meq/g) | molecular weight (×10000) | 2-Isocyanato-ethyl methacrylate | Glycidyl methacrylate | Hydroxyethyl methacrylate |
| Resin F | 80 | 20 | — | — | — | — | 1.10 | 85 | 15 | — | — |
| Resin G | 80 | 18 | 2 | — | — | — | 0.40 | 72 | 5 | — | — |
| Resin H | 80 | 10 | 10 | — | — | — | 0.40 | 60 | — | 5 | — |
| Resin I | 90 | 5 | — | — | — | 5 | 0.30 | 105 | 3.5 | — | — |
| Resin J | 95 | — | — | 5 | — | — | 0.40 | 75 | — | 5 | — |
| Resin K | 90 | — | — | 10 | — | — | 0.30 | 85 | — | 3.5 | — |
| Resin L | 95 | — | — | — | 5 | — | 0.30 | 80 | — | — | 3.5 |

Example 1

(1) Production of Adhesive Tape

A photopolymerization initiator (Esacure One, available from DKSH Japan K.K.) in an amount of 1 part by weight was mixed with an ethyl acetate solution of the resin A for 100 parts by weight of the resin solids content of the solution.

The resulting ethyl acetate solution of the adhesive composition was applied with a doctor blade to a 50-μm-thick transparent polyethylene naphthalate film having a corona treated surface (to the corona treated surface) such that the resulting dry coating film would have a 30 μm thickness. The resulting film coated with the composition was heated at 110° C. for five minutes and thereby the applied liquid was dried. Then, the film was left to stand and cured at 40° C. for three days, whereby an adhesive tape was obtained.

(2) Evaluation of the Modulus of Elasticity of Adhesive Composition after Ultraviolet Light Irradiation A sample for evaluation was prepared as follows. The ethyl acetate solution of the adhesive composition was applied with a doctor blade to a 50-μm-thick transparent polyethylene naphthalate film having a corona treated surface (to the corona treated surface) such that the resulting dry coating film would have a 500 μm thickness. The applied liquid was dried by heating at 110° C. for five minutes, and the resulting film was left to stand and cured at 40° C. for three days. The resulting adhesive tape was cut into a rectangle having a length of 0.6 cm and a width of 1.0 cm. This rectangular piece was used as a sample for evaluation. The surface of the sample was irradiated with 365 nm wavelength ultraviolet light at an irradiation intensity on the tape of 80 mW/cm² for two minutes using an ultrahigh pressure mercury lamp. Thereby, the adhesive component was crosslinked and cured. The storage modulus at 25° C. of the cured sample for evaluation, as measured by dynamic viscoelasticity measurement under shear mode and continuous temperature rise from −50° C. to 300° C. at an angular frequency of 10 Hz, was determined.

(3) Evaluation for Chemical Resistance and Heat Resistance after Ultraviolet Light Irradiation The resulting adhesive tape was cut into a 20-cm-diameter circle. The circular adhesive tape was adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer side of the resulting laminate was subjected to grind grinding and polishing such that the wafer had a 50 μm thickness.

Then, the adhesive component was crosslinked and cured by irradiation with 365 nm wavelength ultraviolet light at an irradiation intensity on the glass plate surface of 80 mW/cm² for one minute from the glass plate side using an ultrahigh pressure mercury lamp.

(3-1)

The laminate including the crosslinked and cured adhesive component was evaluated for the chemical resistance to an acid, base, and organic solvent.

Specifically, a solution of Standard Clean 1 (SC 1) was prepared as an acid, and the laminate including the crosslinked and cured adhesive component was immersed in the SC 1 solution at 60° C. for one hour. The laminate was taken out after the immersion, and the bonded surface between the adhesive tape and the silicon wafer was visually observed from the quartz-glass-plate side. The case where no partial detachment was observed on the whole surface was evaluated as "good (○)", and the case where partial detachment was observed or the adhesive tape was detached was evaluated as "poor (x)".

The same evaluations were conducted using a 2.38% TMAH aqueous solution as a base and acetone as an organic solvent. Table 2 shows the results.

(3-2)

The laminate including the crosslinked and cured adhesive component was evaluated for heat resistance by the following method.

Specifically, a thermal treatment was performed on the laminate including the crosslinked and cured adhesive component at 200° C. for one hour. The thermally treated laminate was taken out and cooled to 25° C. Then, the bonded surface between the adhesive tape and the silicon wafer was visually observed from the quartz-glass-plate side. The case where no partial detachment was observed on the whole surface was evaluated as "good (○)", and the case where partial detachment was observed or the adhesive tape was detached was evaluated as "poor (x)".

The same evaluations were conducted on a 700-μm-thick silicon wafer (circuit wafer) having a circuit with a level difference of about 5 μm.

Table 2 shows the results.

(4) Evaluation of Adhesive Residue after Thermal Treatment

The resulting adhesive tape was cut into a 20-cm-diameter circle and was adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer side of the resulting laminate was subjected to grind grinding and polishing until the thickness of the wafer was 50 μm.

The adhesive component was then crosslinked and cured by irradiation with 365 nm wavelength ultraviolet light at an irradiation intensity on the surface of the glass plate of 80 mW/cm$^2$ for one minute from the glass-plate side using an ultrahigh pressure mercury lamp.

The laminate including the crosslinked and cured adhesive component was subjected to thermal treatment at 200° C. for two hours. A dicing tape was adhered to the thermally treated silicon wafer on the side without the adhesive tape, and the wafer was fixed by suction. Then, the quartz glass plate and the adhesive tape were detached from the wafer.

The adhesive tape-detached surface of the silicon wafer was visually observed. The case where no adhesive was left was evaluated as "excellent (○○)", the case where the area having adhesive residue was less than 5% of the whole area was evaluated as "good (○)", and the case where the area having adhesive residue was 5% or more of the whole area was evaluated as "poor (x)".

Also, the adhesive tape-detached surface of the silicon wafer was observed with an optical microscope at a magnification of 100 times. The case where no adhesive was found in the field of view was evaluated as "excellent (○○)", the case where the area having adhesive residue was less than 5% of the whole field of view was evaluated as "good (○)", and the case where the area having adhesive residue was 5% or more of the whole field of view was evaluated as "poor (x)".

Table 2 shows the results.

Examples 2 to 25, Comparative Example 1

An adhesive composition and an adhesive tape were obtained in the same manner as in Example 1, except that the kind of the resin was as shown in Table 2, and, in the preparation of the adhesive composition, (meth)acrylic group-containing silicone compound (EBECRYL 350, (acrylic equivalent: 2) or EBECRYL 1360 (acrylic equivalent: 6), available from DAICEL-ALLNEX LTD.), and a plasticizer (UN-2600, UN-5500, or UN-7700, available from Negami Chemical Industrial Co., Ltd.) were further added according to Table 2. The resulting adhesive tape was subjected to the same evaluations as in Example 1.

In Comparative Example 1, the adhesive component was not crosslinked or cured by ultraviolet light irradiation in the evaluation for chemical resistance, heat resistance, and adhesive residue.

Table 2 shows the results.

TABLE 2

| | | Photopolymerization initiator | Silicone compound | | Plasticizer | | | Modulus of |
|---|---|---|---|---|---|---|---|---|
| | Resin | Amount (parts by weight) | Trade name | Amount (parts by weight) | Trade name | Amount (parts by weight) | Ultraviolet light irradiation | elasticity after ultraviolet light irradiation (×10$^5$ Pa) |
| Example 1 | Resin A | 1 | — | — | — | — | Irradiated | 28 |
| Example 2 | Resin A | 1 | — | — | — | — | Irradiated | 43 |
| Example 3 | Resin A | 1 | — | — | — | — | Irradiated | 37 |
| Example 4 | Resin A | 1 | EBECRYL350 | 0.5 | — | — | Irradiated | 33 |
| Example 5 | Resin A | 1 | EBECRYL350 | 10 | — | — | Irradiated | 38 |
| Example 6 | Resin A | 1 | EBECRYL350 | 30 | — | — | Irradiated | 49 |
| Example 7 | Resin A | 1 | EBECRYL1360 | 15 | — | — | Irradiated | 43 |
| Example 8 | Resin A | 1 | — | — | UN5500 | 5 | Irradiated | 46 |
| Example 9 | Resin A | 1 | — | — | UN5500 | 20 | Irradiated | 47 |
| Example 10 | Resin A | 1 | — | — | UN5500 | 50 | Irradiated | 42 |
| Example 11 | Resin A | 1 | — | — | UN2600 | 20 | Irradiated | 40 |
| Example 12 | Resin A | 1 | — | — | UN7700 | 20 | Irradiated | 41 |
| Example 13 | Resin A | 1 | EBECRYL350 | 5 | UN5500 | 20 | Irradiated | 42 |
| Example 14 | Resin A | 0.2 | EBECRYL350 | 5 | UN5500 | 20 | Irradiated | 31 |
| Example 15 | Resin B | 1 | EBECRYL350 | 5 | UN5500 | 20 | Irradiated | 28 |
| Example 16 | Resin C | 1 | EBECRYL350 | 5 | UN5500 | 20 | Irradiated | 43 |
| Example 17 | Resin D | 1 | EBECRYL350 | 5 | UN5500 | 20 | Irradiated | 51 |
| Example 18 | Resin E | 1 | EBECRYL350 | 5 | UN5500 | 20 | Irradiated | 79 |
| Example 19 | Resin F | 1 | EBECRYL350 | 5 | UN5500 | 20 | Irradiated | 125 |
| Example 20 | Resin G | 1 | EBECRYL350 | 5 | UN5500 | 20 | Irradiated | 49 |
| Example 21 | Resin H | 1 | EBECRYL350 | 10 | UN5500 | 20 | Irradiated | 52 |
| Example 22 | Resin I | 1 | EBECRYL350 | 5 | UN5500 | 20 | Irradiated | 24 |
| Example 23 | Resin J | 1 | EBECRYL350 | 5 | UN5500 | 20 | Irradiated | 47 |
| Example 24 | Resin K | 1 | EBECRYL350 | 5 | UN5500 | 20 | Irradiated | 26 |
| Example 25 | Resin L | 1 | EBECRYL350 | 5 | UN5500 | 20 | Irradiated | 23 |
| Comparative Example 1 | Resin A | 1 | — | — | — | — | Not irradiated | 0.9 |

TABLE 2-continued

| | Chemical resistance evaluation | | | Heat resistance evaluation | | Adhesive residue evaluation (visual observation) | | Adhesive residue evaluation (microscope) | |
|---|---|---|---|---|---|---|---|---|---|
| | Acid | Base | Organic solvent | Bare wafer | Circuit wafer | Bare wafer | Circuit wafer | Bare wafer | Circuit wafer |
| Example 1 | ○ | ○ | ○ | ○ | ○ | ○○ | ○○ | ○○ | ○○ |
| Example 2 | ○ | ○ | ○ | ○ | ○ | ○○ | ○○ | ○○ | ○○ |
| Example 3 | ○ | ○ | ○ | ○ | ○ | ○○ | ○○ | ○○ | ○○ |
| Example 4 | ○ | ○ | ○ | ○ | ○ | ○○ | ○○ | ○○ | ○○ |
| Example 5 | ○ | ○ | ○ | ○ | ○ | ○○ | ○○ | ○○ | ○○ |
| Example 6 | ○ | ○ | ○ | ○ | ○ | ○○ | ○○ | ○○ | ○○ |
| Example 7 | ○ | ○ | ○ | ○ | ○ | ○○ | ○○ | ○○ | ○○ |
| Example 8 | ○ | ○ | ○ | ○ | ○ | ○○ | ○○ | ○○ | ○○ |
| Example 9 | ○ | ○ | ○ | ○ | ○ | ○○ | ○○ | ○○ | ○○ |
| Example 10 | ○ | ○ | ○ | ○ | ○ | ○○ | ○○ | ○○ | ○○ |
| Example 11 | ○ | ○ | ○ | ○ | ○ | ○○ | ○○ | ○○ | ○○ |
| Example 12 | ○ | ○ | ○ | ○ | ○ | ○○ | ○○ | ○○ | ○○ |
| Example 13 | ○ | ○ | ○ | ○ | ○ | ○○ | ○○ | ○○ | ○○ |
| Example 14 | ○ | ○ | ○ | ○ | ○ | ○○ | ○○ | ○○ | ○○ |
| Example 15 | ○ | ○ | ○ | ○ | ○ | ○○ | ○○ | ○○ | ○○ |
| Example 16 | ○ | ○ | ○ | ○ | ○ | ○○ | ○○ | ○○ | ○○ |
| Example 17 | ○ | ○ | ○ | ○ | ○ | ○○ | ○○ | ○○ | ○○ |
| Example 18 | ○ | ○ | ○ | ○ | ○ | ○○ | ○○ | ○○ | ○○ |
| Example 19 | ○ | ○ | ○ | ○ | ○ | ○○ | ○○ | ○○ | ○○ |
| Example 20 | ○ | ○ | ○ | ○ | ○ | ○○ | ○○ | ○○ | ○○ |
| Example 21 | ○ | ○ | ○ | ○ | ○ | ○○ | ○○ | ○○ | ○○ |
| Example 22 | ○ | ○ | ○ | ○ | ○ | ○○ | ○○ | ○○ | ○○ |
| Example 23 | ○ | ○ | ○ | ○ | ○ | ○○ | ○○ | ○○ | ○○ |
| Example 24 | ○ | ○ | ○ | ○ | ○ | ○○ | ○○ | ○○ | ○○ |
| Example 25 | ○ | ○ | ○ | ○ | ○ | ○○ | ○○ | ○○ | ○○ |
| Comparative Example 1 | X | X | X | X | X | X | X | X | X |

Example 26

(1) Production of Adhesive Tape

For 100 parts by weight of the resin solids content of the ethyl acetate solution of the resin A, 1 part by weight of a photopolymerization initiator (Esacure One, available from DKSH Japan K.K.), 5 parts by weight of a silicone compound (EBECRYL 350, available from DAICEL-ALLNEX LTD.), 20 parts by weight of a plasticizer (UN-5500, available from Negami Chemical Industrial Co., Ltd.) and 10 parts by weight of 5-phenyl-1H-tetrazole as a gas generating agent were mixed with the ethyl acetate solution of the resin A.

The resulting ethyl acetate solution of the adhesive composition was applied with a doctor blade to a 50-μm-thick transparent polyethylene naphthalate film having a corona treated surface (to the corona treated surface) such that the resulting dry coating film would have a 30 μm thickness, and the applied solution was heated and dried at 110° C. for five minutes. Subsequently, the film was left to stand and cured at 40° C. for three days, whereby an adhesive tape was obtained.

(2) Evaluation for Modulus of Elasticity of Adhesive Composition after Ultraviolet Light Irradiation A sample for evaluation was prepared as follows. The ethyl acetate solution of the adhesive composition was applied with a doctor blade to a 50-μm-thick transparent polyethylene naphthalate film having a corona treated surface (to the corona treated surface) such that the resulting dry coating film would have a 500 μm thickness. The applied solution was heated and dried at 110° C. for five minutes. Then, the film was left to stand and cured at 40° C. for three days. The resulting adhesive tape was cut into a rectangle having a length of 0.6 cm and a width of 1.0 cm. This rectangular piece of the tape was used as a sample for evaluation. Next, the adhesive component of the sample was crosslinked and cured by irradiation with 365 nm wavelength ultraviolet light at an irradiation intensity on the surface of the tape of 80 mW/cm² for two minutes using an ultrahigh pressure mercury lamp. The storage modulus at 25° C. of the cured sample for evaluation, as measured by dynamic viscoelasticity measurement under shear mode and continuous temperature rise from −50° C. to 300° C. at an angular frequency of 10 Hz, was determined.

(3) Evaluation for Chemical Resistance and Heat Resistance after Ultraviolet Light Irradiation The resulting adhesive tape was cut into a 20-cm-diameter circle and was adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer-side of the obtained laminate was subjected to grind grinding and polishing until the wafer had a thickness of 50 μm.

Subsequently, the adhesive component of the laminate was crosslinked and cured by irradiation with 365 nm wavelength ultraviolet light at an irradiation intensity on the surface of the glass plate of 80 mW/cm² for one minute from the glass plate side using an ultrahigh pressure mercury lamp.

(3-1)

The laminate including the crosslinked and cured adhesive component was evaluated for the chemical resistance to an acid, base, and organic solvent by the following method.

Specifically, a Standard Clean 1 (SC 1) solution was prepared as an acid, and the laminate including the crosslinked and cured adhesive component was immersed in the SC 1 solution at 60° C. for one hour. The laminate was taken out after the immersion, and the bonded surface between the adhesive tape and the silicon wafer was visually observed from the quartz glass plate side. The case where no partial detachment was observed on the whole surface was evaluated as "good (○)", and the case where partial detachment was observed or the adhesive tape was detached was evaluated as "poor (x)".

The same evaluations were conducted using a 2.38% TMAH aqueous solution as a base and acetone as an organic solvent.

Table 3 shows the results.

(3-2)

The laminate including the crosslinked and cured adhesive component was evaluated for heat resistance by the following method.

Specifically, the laminate including the crosslinked and cured adhesive component was subjected to thermal treatment at 200° C. for one hour. The thermally treated laminate was taken out and the temperature thereof was cooled to 25° C. Then, the bonded surface between the adhesive tape and the silicon wafer was visually observed from the quartz glass plate side. The case where no partial detachment was observed on the whole surface was evaluated as "good (○)", and the case where partial detachment was observed or the adhesive tape was detached was evaluated as "poor (x)".

Table 3 shows the results.

(4) Evaluation of Adhesive Residue after Thermal Treatment

The obtained adhesive tape was cut into a 20-cm-diameter circle and was adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer side of the resulting laminate was subjected to grind grinding and polishing until the wafer had a thickness of 50 μm.

Subsequently, the adhesive component of the laminate was crosslinked and cured by irradiation with 365 nm wavelength ultraviolet light at an irradiation intensity on the surface of the glass plate of 80 mW/cm$^2$ for one minute from the glass plate side using an ultrahigh pressure mercury lamp.

The laminate including the crosslinked and cured adhesive component was subjected to thermal treatment at 200° C. for one hour. A dicing tape was adhered to the thermally treated silicon wafer on the side without the adhesive tape, and the silicon wafer was fixed by suction. The silicon wafer was irradiated with light having an illuminance of 254 nm and an intensity of 70 mW/cm$^2$ for 150 seconds from the Tempax glass side using an ultrahigh pressure mercury lamp. Then, the quartz glass plate and the adhesive tape were detached from the wafer.

The adhesive tape-detached surface of the silicon wafer was visually observed. The case where no adhesive was left was evaluated as "excellent (○○)", the case where the area having adhesive residue was less than 5% of the whole area was evaluated as "good (○)", and the case where the area having adhesive residue was 5% or more of the whole area was evaluated as "poor (x)".

Also, the adhesive tape-detached surface of the silicon wafer was observed with an optical microscope at a magnification of 100 times. The case where no adhesive was left in the field of view was evaluated as "excellent (○○)", the case where the area having adhesive residue was less than 5% of the whole field of view was evaluated as "good (○)", and the case where the area having adhesive residue was 5% or more of the whole field of view was evaluated as "poor (x)".

Table 3 shows the results.

Examples 27 to 45, Comparative Example 2

An adhesive composition and an adhesive tape were obtained in the same manner as in Example 26, except that the kind of the resin and the kind and the amount of the gas generating agent to be blended with the adhesive composition were as shown in Table 3. The obtained adhesive tape was subjected to the same evaluations as in Example 26. In Comparative Example 2, the adhesive component was not crosslinked or cured by ultraviolet light irradiation in the evaluation for chemical resistance, heat resistance, and adhesive residue.

TABLE 3

| | Resin | Photo-polymerization initiator Amount (parts by weight) | Silicone compound Amount (parts by weight) | Plasticizer Amount (parts by weight) | Gas generating agent Compound name | Amount (parts by weight) | Ultraviolet light irradiation | Modulus of elasticity after irradiation (×10$^5$ Pa) |
|---|---|---|---|---|---|---|---|---|
| Example 26 | Resin A | 1 | 5 | 20 | 5-Phenyl-1H-tetrazole | 10 | Irradiated | 44 |
| Example 27 | Resin A | 1 | 5 | 20 | 4,5 Ditetrazolyl-[1,2,3]triazole | 10 | Irradiated | 45 |
| Example 28 | Resin A | 1 | 5 | 20 | 1-(p-Ethoxyphenyl)-5-mercaptotetrazole | 10 | Irradiated | 43 |
| Example 29 | Resin A | 1 | 5 | 20 | 1-(4-Benzamide)-5-mercaptotetrazole | 10 | Irradiated | 43 |
| Example 30 | Resin A | 1 | 5 | 20 | 5-Tolyltetrazole | 10 | Irradiated | 46 |
| Example 31 | Resin A | 1 | 5 | 20 | 2-(5-Tetrazoyl)aniline | 10 | Irradiated | 45 |
| Example 32 | Resin A | 1 | 5 | 20 | 5-(m-Aminophenyl)tetrazole | 10 | Irradiated | 46 |
| Example 33 | Resin A | 1 | 5 | 20 | 5-Acetamide tetrazole | 10 | Irradiated | 47 |
| Example 34 | Resin A | 1 | 5 | 20 | N-(1H tetrazol-5-yl)-n-octane amide | 10 | Irradiated | 48 |
| Example 35 | Resin A | 1 | 5 | 20 | 1-Cyclohexyl-5-chlorobutyl tetrazole | 10 | Irradiated | 44 |

TABLE 3-continued

| | | | | | | | | |
|---|---|---|---|---|---|---|---|---|
| Example 36 | Resin A | 1 | 5 | 20 | Bistetrazole piperazine salt | 10 | Irradiated | 44 |
| Example 37 | Resin A | 1 | 5 | 20 | Bistetrazole diammonium salt | 10 | Irradiated | 45 |
| Example 38 | Resin A | 1 | 5 | 20 | Bistetrazole disodium salt | 10 | Irradiated | 48 |
| Example 39 | Resin A | 1 | 5 | 20 | Bistetrazole monohydrate | 10 | Irradiated | 42 |
| Example 40 | Resin A | 1 | 5 | 20 | Bistetrazole monoammonium | 10 | Irradiated | 43 |
| Example 41 | Resin A | 1 | 5 | 20 | 5-Aminotetrazole monohydrate | 10 | Irradiated | 42 |
| Example 42 | Resin A | 1 | 5 | 20 | 1-Methyl-5-mercaptotetrazole | 10 | Irradiated | 43 |
| Example 43 | Resin A | 1 | 5 | 20 | Bistetrazole disodium salt | 50 | Irradiated | 43 |
| Example 44 | Resin C | 1 | 5 | 20 | Bistetrazole disodium salt | 10 | Irradiated | 42 |
| Example 45 | Resin H | 1 | 5 | 20 | Bistetrazole disodium salt | 10 | Irradiated | 44 |
| Comparative Example 2 | Resin A | 1 | 5 | 20 | 5-Phenyl-1H-tetrazole | 10 | Not irradiated | 0.6 |

| | Chemical resistance evaluation | | | Heat resistance evaluation | | Adhesive residue evaluation (visual observation) | | Adhesive residue evaluation (microscope) | |
|---|---|---|---|---|---|---|---|---|---|
| | Acid | Base | Organic solvent | Bare wafer | Circuit wafer | Bare wafer | Circuit wafer | Bare wafer | Circuit wafer |
| Example 26 | ○ | ○ | ○ | ○ | ○ | ○○ | ○○ | ○○ | ○○ |
| Example 27 | ○ | ○ | ○ | ○ | ○ | ○○ | ○○ | ○○ | ○○ |
| Example 28 | ○ | ○ | ○ | ○ | ○ | ○○ | ○○ | ○○ | ○○ |
| Example 29 | ○ | ○ | ○ | ○ | ○ | ○○ | ○○ | ○○ | ○○ |
| Example 30 | ○ | ○ | ○ | ○ | ○ | ○○ | ○○ | ○○ | ○○ |
| Example 31 | ○ | ○ | ○ | ○ | ○ | ○○ | ○○ | ○○ | ○○ |
| Example 32 | ○ | ○ | ○ | ○ | ○ | ○○ | ○○ | ○○ | ○○ |
| Example 33 | ○ | ○ | ○ | ○ | ○ | ○○ | ○○ | ○○ | ○○ |
| Example 34 | ○ | ○ | ○ | ○ | ○ | ○○ | ○○ | ○○ | ○○ |
| Example 35 | ○ | ○ | ○ | ○ | ○ | ○○ | ○○ | ○○ | ○○ |
| Example 36 | ○ | ○ | ○ | ○ | ○ | ○○ | ○○ | ○○ | ○○ |
| Example 37 | ○ | ○ | ○ | ○ | ○ | ○○ | ○○ | ○○ | ○○ |
| Example 38 | ○ | ○ | ○ | ○ | ○ | ○○ | ○○ | ○○ | ○○ |
| Example 39 | ○ | ○ | ○ | ○ | ○ | ○○ | ○○ | ○○ | ○○ |
| Example 40 | ○ | ○ | ○ | ○ | ○ | ○○ | ○○ | ○○ | ○○ |
| Example 41 | ○ | ○ | ○ | ○ | ○ | ○○ | ○○ | ○○ | ○○ |
| Example 42 | ○ | ○ | ○ | ○ | ○ | ○○ | ○○ | ○○ | ○○ |
| Example 43 | ○ | ○ | ○ | ○ | ○ | ○○ | ○○ | ○○ | ○○ |
| Example 44 | ○ | ○ | ○ | ○ | ○ | ○○ | ○○ | ○○ | ○○ |
| Example 45 | ○ | ○ | ○ | ○ | ○ | ○○ | ○○ | ○○ | ○○ |
| Comparative Example 2 | X | X | X | X | X | X | X | X | X |

Example 46

(1) Production of Adhesive Tape

For 100 parts by weight of the resin solids content of the ethyl acetate solution of the resin A, 1 part by weight of a thermal polymerization initiator (Perhexyl O, available from NOF Corporation) was mixed with the ethyl acetate solution of the resin A.

The resulting ethyl acetate solution of the adhesive composition was applied with a doctor blade to a 50-μm-thick transparent polyethylene naphthalate film having a corona treated surface (to the corona treated surface) such that the resulting dry coating film would have a 30 μm thickness, and the applied solution was dried by heating at 80° C. for five minutes. Then, the film was left to stand and cured at 40° C. for three days, whereby an adhesive tape was obtained.

(2) Evaluation of Modulus of Elasticity of Adhesive Composition Crosslinked and Cured by Heating A sample for evaluation was prepared as follows. The ethyl acetate solution of the adhesive composition was applied with a doctor blade to a 50-μm-thick transparent polyethylene naphthalate film having a corona treated surface (to the corona treated surface) such that the resulting dry coating film would have a 500 μm thickness. The applied solution was heated and dried at 110° C. for five minutes.

The resulting film was left to stand and cured at 40° C. for three days. The resulting adhesive tape was cut into a rectangle having a length of 0.6 cm and a width of 1.0 cm. This rectangular tape was used as a sample for evaluation. The adhesive component of the sample was crosslinked and cured by a thermal treatment at 100° C. for one hour. The storage modulus at 25° C. of the cured sample for evaluation, as measured by dynamic viscoelasticity measurement under shear mode and continuous temperature rise from −50° C. to 300° C. at an angular frequency of 10 Hz, was determined.

(3) Evaluation of Chemical Resistance and Heat Resistance after Heating

The resulting adhesive tape was cut into a 20-cm-diameter circle and was adhered to a silicon wafer having a diameter of 20 cm and a thickness of about 750 μm under vacuum. The other side of the adhesive tape (the side without the silicon wafer) was adhered to a quartz glass plate having a diameter of 20 cm diameter and a thickness of 1 mm under vacuum, whereby a laminate was formed.

The wafer side of the resulting laminate was subjected to grind grinding and polishing until the wafer had a 50 μm thickness.

Then, the adhesive component of the laminate was crosslinked and cured by a thermal treatment at 100° C. for one hour.

(3-1)

The laminate including the crosslinked and cured adhesive component was evaluated for the chemical resistance to an acid, base, and organic solvent by the following method.

Specifically, a Standard Clean 1 (SC1) solution as an acid was prepared, and the laminate including the crosslinked and cured adhesive component was immersed in the SC 1 solution at 60° C. for one hour. The laminate was taken out after the immersion, and the bonded surface between the adhesive tape and the silicon wafer was visually observed from the quartz glass plate side. The case where no partial detachment was observed on the whole surface was evaluated as "good (○)", and the case where partial detachment was observed or the adhesive tape was detached was evaluated as "poor (x)".

The same evaluations were conducted using a 2.38% TMAH aqueous solution as a base and acetone as an organic solvent.

Table 4 shows the results.

(3-2)

The laminate including the crosslinked and cured adhesive component was evaluated for heat resistance by the following method.

Specifically, the laminate including the crosslinked and cured adhesive component was subjected to thermal treatment at 200° C. for one hour. The thermally treated laminate was taken out and the temperature thereof was cooled to 25° C., and the bonded surface between the adhesive tape and the silicon wafer was visually observed from the quartz glass plate side. The case where no partial detachment was observed on the whole surface was evaluated as "good (○)", and the case where partial detachment was observed or the adhesive tape was detached was evaluated as "poor (x)".

The same evaluation was conducted using a 700-μm-thick silicon wafer (circuit wafer) having a circuit with an about 5 μm level difference.

Table 4 shows the results.

(4) Evaluation of Adhesive Residue after High-Temperature Treatment

The resulting adhesive tape was cut into a 20-cm-diameter circle and was adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer side of the resulting laminate was subjected to grind grinding and polishing until the wafer had a 50 μm thickness.

Subsequently, the adhesive component of the laminate was crosslinked and cured by a thermal treatment at 100° C. for one hour.

The laminate including the crosslinked and cured adhesive component was subjected to a thermal treatment at 200° C. for two hours. A dicing tape was adhered to the thermally treated silicon wafer on the side without the adhesive tape, and the wafer was fixed by suction. Then, the quartz glass plate and the adhesive tape were detached from the wafer.

The adhesive tape-detached surface of the silicon wafer was visually observed. The case where no adhesive was left was evaluated as "excellent (○○)", the case where the area having adhesive residue was less than 5% of the whole area was evaluated as "good (○)", and the case where the area having adhesive residue was 5% or more of the whole area was evaluated as "poor (x)".

Also, the adhesive tape-detached surface of the silicon wafer was observed with an optical microscope at a magnification of 100 times. The case where no adhesive was left in the field of view was evaluated as "excellent (○○)", the case where the area having adhesive residue was less than 5% of the whole field of view was evaluated as "good (○)", and the case where the area having adhesive residue was 5% or more of the whole field of view was evaluated as "poor (x)".

Table 4 shows the results.

Examples 47 to 70, Comparative Example 3

An adhesive composition and an adhesive tape were obtained in the same manner as in Example 46, except that the kind of the resin was as shown in Table 4 and that, in the preparation of the adhesive composition, a (meth)acrylic group-containing silicone compound (EBECRYL 350 (acrylic equivalent: 2) or EBECRYL 1360 (acrylic equivalent: 6), available from DAICEL-ALLNEX LTD.) and a plasticizer (UN-2600, UN-5500, or UN-7700, available from Negami Chemical Industrial Co., Ltd.) were further added according to Table 4. The resulting adhesive tape was evaluated in the same manner as in Example 46, except that the adhesive component was crosslinked and cured under the conditions shown in Table 4.

In Comparative Example 3, the adhesive component was not crosslinked or cured by heating in the evaluation for chemical resistance, heat resistance, and adhesive residue.

Table 4 shows the results.

TABLE 4

| | Resin | Thermal polymerization initiator Amount (parts by weight) | Silicone compound Trade name | Amount (parts by weight) | Plasticizer Trade name | Amount (parts by weight) | Crosslinking and curing by heating | Modulus of elasticity after heating ($\times 10^5$ Pa) |
|---|---|---|---|---|---|---|---|---|
| Example 46 | Resin A | 1 | — | — | — | — | 100° C. × 1 hr. | 18 |
| Example 47 | Resin A | 1 | — | — | — | — | 70° C. × 1 hr. | 33 |
| Example 48 | Resin A | 1 | — | — | — | — | 150° C. × 30 min. | 27 |
| Example 49 | Resin A | 1 | EBECRYL350 | 0.5 | — | — | 100° C. × 1 hr. | 24 |
| Example 50 | Resin A | 1 | EBECRYL350 | 10 | — | — | 100° C. × 1 hr. | 30 |
| Example 51 | Resin A | 1 | EBECRYL350 | 30 | — | — | 100° C. × 1 hr. | 41 |
| Example 52 | Resin A | 1 | EBECRYL1360 | 15 | — | — | 100° C. × 1 hr. | 35 |
| Example 53 | Resin A | 1 | — | — | UN5500 | 5 | 100° C. × 1 hr. | 37 |
| Example 54 | Resin A | 1 | — | — | UN5500 | 20 | 100° C. × 1 hr. | 38 |
| Example 55 | Resin A | 1 | — | — | UN5500 | 50 | 100° C. × 1 hr. | 34 |
| Example 56 | Resin A | 1 | — | — | UN2600 | 20 | 100° C. × 1 hr. | 31 |

TABLE 4-continued

| | | | | | | | | |
|---|---|---|---|---|---|---|---|---|
| Example 57 | Resin A | 1 | — | — | UN7700 | 20 | 100° C. × 1 hr. | 32 |
| Example 58 | Resin A | 1 | EBECRYL350 | 5 | UN5500 | 20 | 100° C. × 1 hr. | 33 |
| Example 59 | Resin A | 0.2 | EBECRYL350 | 5 | UN5500 | 20 | 100° C. × 1 hr. | 21 |
| Example 60 | Resin B | 1 | EBECRYL350 | 5 | UN5500 | 20 | 100° C. × 1 hr. | 20 |
| Example 61 | Resin C | 1 | EBECRYL350 | 5 | UN5500 | 20 | 100° C. × 1 hr. | 35 |
| Example 62 | Resin D | 1 | EBECRYL350 | 5 | UN5500 | 20 | 100° C. × 1 hr. | 44 |
| Example 63 | Resin E | 1 | EBECRYL350 | 5 | UN5500 | 20 | 100° C. × 1 hr. | 71 |
| Example 64 | Resin F | 1 | EBECRYL350 | 5 | UN5500 | 20 | 100° C. × 1 hr. | 110 |
| Example 65 | Resin G | 1 | EBECRYL350 | 5 | UN5500 | 20 | 100° C. × 1 hr. | 40 |
| Example 66 | Resin H | 1 | EBECRYL350 | 10 | UN5500 | 20 | 100° C. × 1 hr. | 44 |
| Example 67 | Resin I | 1 | EBECRYL350 | 5 | UN5500 | 20 | 100° C. × 1 hr. | 16 |
| Example 68 | Resin J | 1 | EBECRYL350 | 5 | UN5500 | 20 | 100° C. × 1 hr. | 40 |
| Example 69 | Resin K | 1 | EBECRYL350 | 5 | UN5500 | 20 | 100° C. × 1 hr. | 18 |
| Example 70 | Resin L | 1 | EBECRYL350 | 5 | UN5500 | 20 | 100° C. × 1 hr. | 15 |
| Comparative Example 3 | Resin A | 1 | — | — | — | — | N/A | 0.7 |

| | Chemical resistance evaluation | | | Heat resistance evaluation | | Adhesive residue evaluation (visual observation) | | Adhesive residue evaluation (microscope) | |
|---|---|---|---|---|---|---|---|---|---|
| | Acid | Base | Organic solvent | Bare wafer | Circuit wafer | Bare wafer | Circuit wafer | Bare wafer | Circuit wafer |
| Example 46 | ○ | ○ | ○ | ○ | ○ | ○○ | ○○ | ○○ | ○○ |
| Example 47 | ○ | ○ | ○ | ○ | ○ | ○○ | ○○ | ○○ | ○○ |
| Example 48 | ○ | ○ | ○ | ○ | ○ | ○○ | ○○ | ○○ | ○○ |
| Example 49 | ○ | ○ | ○ | ○ | ○ | ○○ | ○○ | ○○ | ○○ |
| Example 50 | ○ | ○ | ○ | ○ | ○ | ○○ | ○○ | ○○ | ○○ |
| Example 51 | ○ | ○ | ○ | ○ | ○ | ○○ | ○○ | ○○ | ○○ |
| Example 52 | ○ | ○ | ○ | ○ | ○ | ○○ | ○○ | ○○ | ○○ |
| Example 53 | ○ | ○ | ○ | ○ | ○ | ○○ | ○○ | ○○ | ○○ |
| Example 54 | ○ | ○ | ○ | ○ | ○ | ○○ | ○○ | ○○ | ○○ |
| Example 55 | ○ | ○ | ○ | ○ | ○ | ○○ | ○○ | ○○ | ○○ |
| Example 56 | ○ | ○ | ○ | ○ | ○ | ○○ | ○○ | ○○ | ○○ |
| Example 57 | ○ | ○ | ○ | ○ | ○ | ○○ | ○○ | ○○ | ○○ |
| Example 58 | ○ | ○ | ○ | ○ | ○ | ○○ | ○○ | ○○ | ○○ |
| Example 59 | ○ | ○ | ○ | ○ | ○ | ○○ | ○○ | ○○ | ○○ |
| Example 60 | ○ | ○ | ○ | ○ | ○ | ○○ | ○○ | ○○ | ○○ |
| Example 61 | ○ | ○ | ○ | ○ | ○ | ○○ | ○○ | ○○ | ○○ |
| Example 62 | ○ | ○ | ○ | ○ | ○ | ○○ | ○○ | ○○ | ○○ |
| Example 63 | ○ | ○ | ○ | ○ | ○ | ○○ | ○○ | ○○ | ○○ |
| Example 64 | ○ | ○ | ○ | ○ | ○ | ○○ | ○○ | ○○ | ○○ |
| Example 65 | ○ | ○ | ○ | ○ | ○ | ○○ | ○○ | ○○ | ○○ |
| Example 66 | ○ | ○ | ○ | ○ | ○ | ○○ | ○○ | ○○ | ○○ |
| Example 67 | ○ | ○ | ○ | ○ | ○ | ○○ | ○○ | ○○ | ○○ |
| Example 68 | ○ | ○ | ○ | ○ | ○ | ○○ | ○○ | ○○ | ○○ |
| Example 69 | ○ | ○ | ○ | ○ | ○ | ○○ | ○○ | ○○ | ○○ |
| Example 70 | ○ | ○ | ○ | ○ | ○ | ○○ | ○○ | ○○ | ○○ |
| Comparative Example 3 | X | X | X | ○ | X | X | X | X | X |

Example 71

(1) Production of Adhesive Tape

For 100 parts by weight of the resin solids content of the ethyl acetate solution of the resin A, 1 part by weight of a thermal polymerization initiator (Perhexyl O, available from NOF Corporation), 5 parts by weight of a silicone compound (EBECRYL 350, available from DAICEL-ALLNEX LTD.), 20 parts by weight of a plasticizer (UN-5500, available from Negami Chemical Industrial Co., Ltd.), and 10 parts by weight of 5-phenyl-1H-tetrazole as a gas generating agent were mixed with the ethyl acetate solution of the resin A.

The resulting ethyl acetate solution of the adhesive composition was applied with a doctor blade to a 50-μm-thick transparent polyethylene naphthalate film having a corona treated surface (to the corona treated surface) such that the resulting dry coating film would have a 30 μm thickness. The applied solution was heated and dried at 80° C. for five minutes. The film was then left to stand and cured at 40° C. for three days. Thus, an adhesive tape was obtained.

(2) Evaluation of the Modulus of Elasticity of the Adhesive Composition Crosslinked and Cured by Heating A sample for evaluation was prepared as follows. The ethyl acetate solution of the adhesive composition was applied with a doctor blade to a 50-μm-thick transparent polyethylene naphthalate film having a corona treated surface (to the corona treated surface) such that the resulting dry coating film would have a 500 μm thickness. The applied solution was heated and dried at 110° C. for five minutes. The resulting film was left to stand and cured at 40° C. for three days. The resulting adhesive tape was cut into a rectangle having a length of 0.6 cm and a width of 1.0 cm. This rectangular piece was used as a sample for evaluation. Then, the adhesive component of the sample was crosslinked and cured by a thermal treatment at 100° C. for one hour. The storage modulus at 25° C. of the cured sample for evaluation, as measured by dynamic viscoelasticity measurement under shear mode and continuous temperature rise from −50° C. to 300° C. at an angular frequency of 10 Hz, was determined.

(3) Evaluation for Chemical Resistance and Heat Resistance after Heating

The resulting adhesive tape was cut into a 20-cm-diameter circle and adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer side of the resulting laminate was subjected to grind grinding and polishing until the wafer had a 50 μm thickness.

Subsequently, the adhesive component of the laminate was crosslinked and cured by a thermal treatment at 100° C. for one hour.

(3-1)

The laminate including the crosslinked and cured adhesive component was evaluated for the chemical resistance to an acid, base, and organic solvent by the following method.

Specifically, a Standard Clean 1 (SC1) solution was prepared as an acid, and the laminate including the crosslinked and cured adhesive component was immersed in the SC 1 solution at 60° C. for one hour. The laminate was taken out after the immersion, and the bonded surface between the adhesive tape and the silicon wafer was visually observed from the quartz glass plate side. The case where no partial detachment was observed on the whole surface was evaluated as "good (o)", and the case where partial detachment was observed or the adhesive tape was detached was evaluated as "poor (x)".

The same evaluations were conducted using a 2.38% TMAH aqueous solution as a base and acetone as an organic solvent.

Table 5 shows the results.

(3-2)

The laminate including the crosslinked and cured adhesive component was evaluated for the heat resistance by the following method.

Specifically, the laminate including the crosslinked and cured adhesive component was subjected to thermal treatment at 200° C. for one hour. The thermally treated laminate was taken out and the temperature thereof was cooled to 25° C. The bonded surface between the adhesive tape and the silicon wafer was then visually observed from the quartz glass plate side. The case where no partial detachment was observed on the whole surface was evaluated as "good (o)", and the case where partial detachment was observed or the adhesive tape was detached was evaluated as "poor (x)".

Table 5 shows the results.

(4) Evaluation of Adhesive Residue after High-Temperature Treatment

The resulting adhesive tape was cut into a 20-cm-diameter circle and adhered to a silicon wafer having a diameter of 20 cm and a thickness of about 750 μm under vacuum. The other side of the adhesive tape (the side without the silicon wafer) was adhered to a quartz glass plate having a diameter of 20 cm and a thickness of 1 mm under vacuum, whereby a laminate was formed.

The wafer side of the resulting laminate was subjected to grind grinding and polishing until the wafer had a 50 μm thickness.

Subsequently, the adhesive component of the laminate was crosslinked and cured by a thermal treatment at 100° C. for one hour.

The laminate including the crosslinked and cured adhesive component was subjected to a thermal treatment at 200° C. for two hours. A dicing tape was adhered to the thermally treated silicon wafer on the side without the adhesive tape, and the wafer was fixed by suction. Then, the wafer was irradiated with light having an illuminance of 254 nm and an intensity of 70 mW/cm$^2$ for 150 seconds from the Tempax glass side using an ultrahigh pressure mercury lamp. Then, the quartz glass plate and the adhesive tape were detached from the wafer.

The surface of the adhesive tape-detached surface of the silicon wafer was visually observed. The case where no adhesive was left was evaluated as "excellent (oo)", the case where the area having adhesive residue was less than 5% of the whole area was evaluated as "good (o)", and the case where the area having adhesive residue was 5% or more of the whole area was evaluated as "poor (x)".

Also, the surface of the adhesive tape-detached surface of the silicon wafer was observed with an optical microscope at a magnification of 100 times. The case where no adhesive was left in the field of view was evaluated as "excellent (oo)", the case where the area having adhesive residue was less than 5% of the whole field of view was evaluated as "good (o)", and the case where the area having adhesive residue was 5% or more of the whole field of view was evaluated as "poor (x)".

Table 5 shows the results.

Examples 72 to 90, Comparative Example 4

An adhesive composition and an adhesive tape were obtained in the same manner as in Example 71, except that the kind of the resin and the kind and the amount of the gas generating agents to be blended with the adhesive composition were as shown in Table 5. The resulting adhesive tape was evaluated in the same manner as in Example 71.

In Comparative Example 4, the adhesive component was not crosslinked or cured by heating in the evaluation for chemical resistance, heat resistance, and adhesive residue.

TABLE 5

| | Resin | Thermal polymerization initiator Amount (parts by weight) | Silicone compound Amount (parts by weight) | Plasticizer Amount (parts by weight) | Gas generating agent Compound name | Gas generating agent Amount (parts by weight) | Crosslinking and curing by heating | Modulus of elasticity after heating (×10$^5$ Pa) |
|---|---|---|---|---|---|---|---|---|
| Example 71 | Resin A | 1 | 5 | 20 | 5-Phenyl-1H-tetrazole | 10 | 100° C. × 1 hr. | 37 |
| Example 72 | Resin A | 1 | 5 | 20 | 4,5 Ditetrazolyl-[1,2,3]triazole | 10 | 100° C. × 1 hr. | 38 |
| Example 73 | Resin A | 1 | 5 | 20 | 1-(p-Ethoxyphenyl)-5-mercaptotetrazole | 10 | 100° C. × 1 hr. | 34 |
| Example 74 | Resin A | 1 | 5 | 20 | 1-(4-Benzamide)-5-mercaptotetrazole | 10 | 100° C. × 1 hr. | 35 |
| Example 75 | Resin A | 1 | 5 | 20 | 5-Tolyltetrazole | 10 | 100° C. × 1 hr. | 38 |
| Example 76 | Resin A | 1 | 5 | 20 | 2-(5-Tetrazoyl)aniline | 10 | 100° C. × 1 hr. | 36 |
| Example 77 | Resin A | 1 | 5 | 20 | 5-(m-Aminophenyl)tetrazole | 10 | 100° C. × 1 hr. | 38 |

TABLE 5-continued

| | | | | | | | | |
|---|---|---|---|---|---|---|---|---|
| Example 78 | Resin A | 1 | 5 | 20 | 5-Acetamide tetrazole | 10 | 100° C. × 1 hr. | 39 |
| Example 79 | Resin A | 1 | 5 | 20 | N-(1H tetrazol-5-yl)-n-octane amide | 10 | 100° C. × 1 hr. | 40 |
| Example 80 | Resin A | 1 | 5 | 20 | 1-Cyclohexyl-5-chlorobutyl tetrazole | 10 | 100° C. × 1 hr. | 35 |
| Example 81 | Resin A | 1 | 5 | 20 | Bistetrazole piperazine salt | 10 | 100° C. × 1 hr. | 36 |
| Example 82 | Resin A | 1 | 5 | 20 | Bistetrazole diammonium salt | 10 | 100° C. × 1 hr. | 35 |
| Example 83 | Resin A | 1 | 5 | 20 | Bistetrazole disodium salt | 10 | 100° C. × 1 hr. | 39 |
| Example 84 | Resin A | 1 | 5 | 20 | Bistetrazole monohydrate | 10 | 100° C. × 1 hr. | 34 |
| Example 85 | Resin A | 1 | 5 | 20 | Bistetrazole monoammonium | 10 | 100° C. × 1 hr. | 36 |
| Example 86 | Resin A | 1 | 5 | 20 | 5-Aminotetrazole monohydrate | 10 | 100° C. × 1 hr. | 34 |
| Example 87 | Resin A | 1 | 5 | 20 | 1-Methyl-5-mercaptotetrazole | 10 | 100° C. × 1 hr. | 34 |
| Example 88 | Resin A | 1 | 5 | 20 | Bistetrazole disodium salt | 50 | 100° C. × 1 hr. | 35 |
| Example 89 | Resin C | 1 | 5 | 20 | Bistetrazole disodium salt | 10 | 100° C. × 1 hr. | 33 |
| Example 90 | Resin H | 1 | 5 | 20 | Bistetrazole disodium salt | 10 | 100° C. × 1 hr. | 36 |
| Comparative Example 4 | Resin A | 1 | 5 | 20 | 5-Phenyl-1H-tetrazole | 10 | N/A | 0.5 |

| | Chemical resistance evaluation | | | Heat resistance evaluation | | Adhesive residue evaluation (visual observation) | | Adhesive residue evaluation (microscope) | |
|---|---|---|---|---|---|---|---|---|---|
| | Acid | Base | Organic solvent | Bare wafer | Circuit wafer | Bare wafer | Circuit wafer | Bare wafer | Circuit wafer |
| Example 71 | ○ | ○ | ○ | ○ | ○ | ○○ | ○○ | ○○ | ○○ |
| Example 72 | ○ | ○ | ○ | ○ | ○ | ○○ | ○○ | ○○ | ○○ |
| Example 73 | ○ | ○ | ○ | ○ | ○ | ○○ | ○○ | ○○ | ○○ |
| Example 74 | ○ | ○ | ○ | ○ | ○ | ○○ | ○○ | ○○ | ○○ |
| Example 75 | ○ | ○ | ○ | ○ | ○ | ○○ | ○○ | ○○ | ○○ |
| Example 76 | ○ | ○ | ○ | ○ | ○ | ○○ | ○○ | ○○ | ○○ |
| Example 77 | ○ | ○ | ○ | ○ | ○ | ○○ | ○○ | ○○ | ○○ |
| Example 78 | ○ | ○ | ○ | ○ | ○ | ○○ | ○○ | ○○ | ○○ |
| Example 79 | ○ | ○ | ○ | ○ | ○ | ○○ | ○○ | ○○ | ○○ |
| Example 80 | ○ | ○ | ○ | ○ | ○ | ○○ | ○○ | ○○ | ○○ |
| Example 81 | ○ | ○ | ○ | ○ | ○ | ○○ | ○○ | ○○ | ○○ |
| Example 82 | ○ | ○ | ○ | ○ | ○ | ○○ | ○○ | ○○ | ○○ |
| Example 83 | ○ | ○ | ○ | ○ | ○ | ○○ | ○○ | ○○ | ○○ |
| Example 84 | ○ | ○ | ○ | ○ | ○ | ○○ | ○○ | ○○ | ○○ |
| Example 85 | ○ | ○ | ○ | ○ | ○ | ○○ | ○○ | ○○ | ○○ |
| Example 86 | ○ | ○ | ○ | ○ | ○ | ○○ | ○○ | ○○ | ○○ |
| Example 87 | ○ | ○ | ○ | ○ | ○ | ○○ | ○○ | ○○ | ○○ |
| Example 88 | ○ | ○ | ○ | ○ | ○ | ○○ | ○○ | ○○ | ○○ |
| Example 89 | ○ | ○ | ○ | ○ | ○ | ○○ | ○○ | ○○ | ○○ |
| Example 90 | ○ | ○ | ○ | ○ | ○ | ○○ | ○○ | ○○ | ○○ |
| Comparative Example 4 | X | X | X | X | X | X | X | X | X |

Examples 91 to 93, Comparative Example 5

An adhesive composition and an adhesive tape were obtained in the same manner as in Example 1, except that the kind of resin was as shown in Table 6, and, in the preparation of the adhesive composition, a fumed silica dispersed solution (REOLOSIL MT-10, available from Tokuyama Corporation), in which fumed silica was dispersed in methyl ethyl ketone with a homogenizer and the average particle size of the silica was adjusted to be 0.1 μm; a (meth)acrylic group-containing silicone compound (EBECRYL 350 (acrylic equivalent: 2), available from DAICEL-ALLNEX LTD.); and a plasticizer (UN-5500, available from Negami Chemical Industrial Co., Ltd.) were added according to Table 6. The resulting adhesive tape was evaluated in the same manner as in Example 1.

In Comparative Example 5, the adhesive component was not crosslinked or cured by ultraviolet light irradiation in the evaluation for chemical resistance, heat resistance, and adhesive residue.

Table 6 shows the results.

TABLE 6

| | | Fumed silica (MT10) | | | Photopolymerization initiator | Silicone compound | | Plasticizer | | |
|---|---|---|---|---|---|---|---|---|---|---|
| | Resin | Trade name | Average particle size (μm) | Amount (parts by weight) | Amount (parts by weight) | Trade name | Amount (parts by weight) | Trade name | Amount (parts by weight) | Ultraviolet light irradiation |
| Example 91 | Resin A | MT10 | 0.1 | 5 | 1 | EBECRYL 350 | 5 | UN 5500 | 20 | Irradiated |

TABLE 6-continued

| | | | | | | | | | | | |
|---|---|---|---|---|---|---|---|---|---|---|---|
| Example 92 | Resin A | MT10 | 0.1 | 10 | 1 | EBECRYL 350 | 5 | UN 5500 | 20 | Irradiated |
| Example 93 | Resin A | MT10 | 0.1 | 15 | 1 | EBECRYL 350 | 5 | UN 5500 | 20 | Irradiated |
| Comparative Example 5 | Resin A | MT10 | 0.1 | 5 | 1 | EBECRYL 350 | 5 | UN 5500 | 20 | Not irradiated |

| | Modulus of elasticity after ultraviolet light irradiation ($\times 10^5$ Pa) | Chemical resistance evaluation | | | Heat resistance evaluation | | Adhesive residue evaluation (visual observation) | | Adhesive residue evaluation (microscope) | |
|---|---|---|---|---|---|---|---|---|---|---|
| | | Acid | Base | Organic solvent | Bare wafer | Circuit wafer | Bare wafer | Circuit wafer | Bare wafer | Circuit wafer |
| Example 91 | 51 | ○ | ○ | ○ | ○ | ○ | ○○ | ○○ | ○○ | ○○ |
| Example 92 | 53 | ○ | ○ | ○ | ○ | ○ | ○○ | ○○ | ○○ | ○○ |
| Example 93 | 55 | ○ | ○ | ○ | ○ | ○ | ○○ | ○○ | ○○ | ○○ |
| Comparative Example 5 | 0.9 | X | X | X | ○ | X | X | X | X | X |

INDUSTRIAL APPLICABILITY

The present invention provides a method of treating a wafer in the state where the wafer is fixed on a support plate via an adhesive composition. Although the wafer is treated by a chemical, heating, or exothermic treatment, the method of treating a wafer achieves sufficient adhesiveness during the step of treating a surface of the wafer and allows detachment of the support plate from the wafer without damaging the wafer or leaving the adhesive on the wafer after the wafer treating step.

The invention claimed is:

1. A method of treating a wafer, comprising the steps of:
   obtaining a double-sided adhesive tape having an adhesive layer formed from an adhesive composition containing a curable adhesive component to be crosslinked and cured by light irradiation or heating;
   fixing a wafer on a support plate via the double-sided adhesive tape;
   crosslinking and curing the curable adhesive component by light irradiation at an integrated illuminance of 300 millijoule or more or heating of the adhesive composition;
   treating a surface of the wafer fixed on the support plate by a chemical, heating, or exothermic treatment after the crosslinking and the curing of the curable adhesive component by light irradiation; and
   detaching the support plate from the treated wafer,
   wherein the adhesive composition has a storage shear modulus at 25° C. of $2.0 \times 10^5$ to $10^8$ Pa, as measured by dynamic viscoelasticity measurement under shear mode and continuous temperature rise from −50° C. to 300° C., after the step of crosslinking and curing the curable adhesive component,
   wherein the adhesive composition comprises a gas generating agent that generates a gas by stimulation, and, in the step of detaching the support plate, the support plate is detached from the wafer by stimulating the treated wafer and thereby causing gas generation from the gas generating agent, and
   wherein the crosslinking and curing of the curable adhesive component does not cause the support plate to detach from the wafer.

* * * * *